United States Patent
Ochi

(10) Patent No.: US 9,437,517 B2
(45) Date of Patent: Sep. 6, 2016

(54) SEMICONDUCTOR APPARATUS INCLUDING A HEAT DISSIPATING MEMBER

(71) Applicant: Panasonic Corporation, Osaka (JP)

(72) Inventor: Takao Ochi, Niigata (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/788,853

(22) Filed: Jul. 1, 2015

(65) Prior Publication Data

US 2015/0303125 A1 Oct. 22, 2015

Related U.S. Application Data

(63) Continuation of application No. PCT/JP2013/007536, filed on Dec. 24, 2013.

(30) Foreign Application Priority Data

Jan. 7, 2013 (JP) .................................. 2013-000522

(51) Int. Cl.
*H01L 23/367* (2006.01)
*H01L 23/00* (2006.01)
(Continued)

(52) U.S. Cl.
CPC .............. *H01L 23/367* (2013.01); *H01L 21/56* (2013.01); *H01L 21/561* (2013.01); *H01L 21/565* (2013.01); *H01L 23/13* (2013.01); *H01L 23/29* (2013.01); *H01L 23/3128* (2013.01);
(Continued)

(58) Field of Classification Search
CPC ........... H01L 23/367; H01L 23/49568; H01L 23/3135; H01L 23/13; H01L 23/4334; H01L 24/48; H01L 24/49; H01L 2224/04042; H01L 23/28; H01L 2924/181
See application file for complete search history.

(56) References Cited

U.S. PATENT DOCUMENTS

| 5,108,955 A | 4/1992 | Ishida et al. |
| 5,179,039 A | 1/1993 | Ishida et al. |

(Continued)

FOREIGN PATENT DOCUMENTS

| JP | 7-142627 | 6/1995 |
| JP | 2679806 B | 11/1997 |

(Continued)

OTHER PUBLICATIONS

International Search Report of PCT application No. PCT/JP2013/007536 dated Mar. 11, 2014.

*Primary Examiner* — Jasmine Clark

(74) *Attorney, Agent, or Firm* — McDermott Will & Emery LLP

(57) ABSTRACT

A semiconductor apparatus is provided. The semiconductor apparatus includes: a base having a main surface on which a terminal is disposed; a first semiconductor device retained on the main surface of the base and having a top surface on which an electrode is disposed and a bottom surface facing the main surface of the base; a connection member connecting the terminal and the electrode; an encapsulant disposed on the main surface of the base and covering the terminal, the first semiconductor device and the connection member; and a heat dissipating member disposed on the encapsulant and having a space that opens in a direction extending perpendicular to the main surface of the base. The encapsulant is disposed in the space and, in a side view of the base, a peak of the connection member is located inside the space.

19 Claims, 35 Drawing Sheets

(51) Int. Cl.
*H01L 23/31* (2006.01)
*H01L 23/433* (2006.01)
*H01L 21/56* (2006.01)
*H01L 23/29* (2006.01)
*H01L 23/495* (2006.01)
*H01L 25/065* (2006.01)
*H01L 23/13* (2006.01)

(52) U.S. Cl.
CPC ....... *H01L23/3135* (2013.01); *H01L 23/3178* (2013.01); *H01L 23/4334* (2013.01); *H01L 23/49517* (2013.01); *H01L 23/49568* (2013.01); *H01L 24/49* (2013.01); *H01L 24/97* (2013.01); *H01L 25/0652* (2013.01); *H01L 24/06* (2013.01); *H01L 24/32* (2013.01); *H01L 24/48* (2013.01); *H01L 24/73* (2013.01); *H01L 24/92* (2013.01); *H01L 2224/04042* (2013.01); *H01L 2224/05554* (2013.01); *H01L 2224/06135* (2013.01); *H01L 2224/32225* (2013.01); *H01L 2224/32245* (2013.01); *H01L 2224/45144* (2013.01); *H01L 2224/45644* (2013.01); *H01L 2224/45647* (2013.01); *H01L 2224/48091* (2013.01); *H01L 2224/48227* (2013.01); *H01L 2224/49107* (2013.01); *H01L 2224/49175* (2013.01); *H01L 2224/73265* (2013.01); *H01L 2224/92247* (2013.01); *H01L 2224/97* (2013.01); *H01L 2924/1531* (2013.01); *H01L 2924/181* (2013.01)

(56) References Cited

U.S. PATENT DOCUMENTS

| | | |
|---|---|---|
| 5,233,225 A | 8/1993 | Ishida et al. |
| 5,289,039 A | 2/1994 | Ishida et al. |
| 5,625,222 A | 4/1997 | Yoneda et al. |
| 5,708,567 A | 1/1998 | Shim et al. |
| 6,281,045 B1 | 8/2001 | Murata |
| 8,581,374 B1 * | 11/2013 | Chen ................... H01L 23/4334 257/675 |
| 2007/0164425 A1 * | 7/2007 | Kolan .................. H01L 21/565 257/712 |
| 2009/0001561 A1 | 1/2009 | Chua et al. |
| 2011/0316131 A1 | 12/2011 | Fukuda et al. |
| 2012/0319264 A1 | 12/2012 | Fukuda et al. |
| 2012/0319275 A1 | 12/2012 | Fukuda et al. |
| 2012/0322209 A1 | 12/2012 | Fukuda et al. |

FOREIGN PATENT DOCUMENTS

| | | |
|---|---|---|
| JP | 10-209348 | 8/1998 |
| JP | 10-308466 | 11/1998 |
| JP | 3514101 B | 3/2004 |
| JP | 2006-059871 | 3/2006 |
| JP | 2010-514208 | 4/2010 |
| JP | 2010-114256 | 5/2010 |
| JP | 2012-009726 | 1/2012 |

* cited by examiner

SEMICONDUCTOR APPARATUS INCLUDING A HEAT DISSIPATING MEMBER

BACKGROUND OF THE INVENTION

1. Field of the Invention

The present disclosure relates to a semiconductor apparatus including a heat dissipating member, and a method of manufacturing such a semiconductor apparatus.

2. Description of the Related Art

In recent years, the development of high-capacity, highly-integrated semiconductor devices has resulted in greater power consumption, necessitating an improvement in heat dissipation properties of semiconductor apparatuses.

In response to this problem, in conventional semiconductor apparatuses, a heat dissipating plate has been attached to the main surface of the semiconductor apparatus to improve the heat dissipation properties of the semiconductor apparatus.

The structure of a conventional semiconductor apparatus will be described hereinafter.

A conventional semiconductor apparatus includes a semiconductor device, a substrate, a connection member, a resin encapsulant, and a heat dissipating plate. The semiconductor device is fixed to the substrate with a die bonding paste, and an electrode of the semiconductor device and an internal terminal of the substrate are connected by a connection member. The semiconductor device, the connection member, and the internal terminal of the substrate are coated and covered by the resin encapsulant, and the heat dissipating plate is attached to the resin encapsulant with an adhesive (for example, see Patent Literature (PTL) 1 and 2).

CITATION LIST

Patent Literature

PTL 1: Japanese Patent No. 2,679,806
PTL 2: Japanese Patent No. 3,514,101

SUMMARY OF THE INVENTION

First, the semiconductor apparatus disclosed in patent literature (PTL) 1 will be described with reference to FIG. 21 as a first conventional example.

As illustrated in FIG. 21, the semiconductor apparatus according to the first conventional example includes semiconductor device 101, substrate 102, wire 103, heat dissipating plate 104, and resin encapsulant 105. Semiconductor device 101 is fixed to substrate 102 with die bonding paste 106. The electrode of semiconductor device 101 and the internal terminal of substrate 102 are connected by wire 103. Heat dissipating plate 104 is disposed above semiconductor device 101 with resin encapsulant 105 interposed between semiconductor device 101 and heat dissipating plate 104. Semiconductor device 101, substrate 102, wire 103, and heat dissipating plate 104 are encapsulated as an integral unit by resin encapsulant 105.

A recess is formed in heat dissipating plate 104 at a location of interference with wire 103. This makes it possible to keep the semiconductor apparatus thin. To assemble heat dissipating plate 104 to the semiconductor apparatus, an individual heat dissipating plate 104 for each semiconductor apparatus is prepared in advance and embedded in the top portion of resin encapsulant 105 at the time of encapsulation. With this method, since the outer shape of heat dissipating plate 104 is slightly smaller than the outer shape of the semiconductor apparatus, heat dissipating plate 104 is exposed only from the top surface of the semiconductor apparatus, and not from the side surfaces.

Although the semiconductor apparatus can be made thin by forming a recess in heat dissipating plate 104 that circumvents wire 103, the residual thickness of the recessed portion remains. This means the thickness of the semiconductor apparatus increases by that amount. Moreover, there is a limit to how small the gap between heat dissipating plate 104 and semiconductor device 101 and the gap between heat dissipating plate 104 and substrate 102 can be made due to the intricate working shapes, the filling properties of resin encapsulant 105, and the necessity to secure a flow channel for resin encapsulant 105. This is problematic for achieving a thin semiconductor apparatus. Furthermore, since the exposed surface of heat dissipating plate 104 is limited to the top surface of the semiconductor apparatus, heat dissipation properties diminish.

Next, the semiconductor apparatus and method of manufacturing the semiconductor apparatus disclosed in PTL 2 will be described with reference to FIG. 22 as a second conventional example. Note that (a) through (e) in FIG. 22 each illustrate a manufacturing process in the method of manufacturing the semiconductor apparatus according to the second conventional example. The manufacturing processes are performed in order from (a) to (e).

As illustrated in (e) in FIG. 22, the semiconductor apparatus according to the second conventional example includes semiconductor device 201, substrate 202, heat dissipating plate 204, and resin encapsulant 205. Semiconductor device 201 is disposed such that the main surface of semiconductor device 201 faces the main surface of substrate 202. The electrode on the main surface of semiconductor device 201 and the internal terminal of substrate 202 are bonded together. The flat, plate shaped heat dissipating plate 204 is fixed to the rear surface of semiconductor device 201, and the gap between substrate 202 and heat dissipating plate 204 is filled with resin encapsulant 205 to encapsulate everything as an integral unit.

Furthermore, as illustrated in (a) through (e) in FIG. 22, the method of manufacturing the semiconductor apparatus according to the second conventional example includes mounting a plurality of semiconductor devices 201 on a single substrate 202 such that the main surfaces of the plurality of semiconductor devices 201 face the main surface of substrate 202, and then fixing a single heat dissipating plate 204 to the rear surfaces of the plurality of semiconductor devices 201 with an adhesive. Next, the gap between substrate 202 and heat dissipating plate 204 is filled with resin encapsulant 205 to encapsulate everything as an integral unit. Then, the semiconductor apparatuses along with heat dissipating plate 204 are diced to obtain individual semiconductor apparatuses.

As described above, in the second conventional example, since the flip chip method is used, heat dissipating plate 204 can be attached directly to the rear surfaces of semiconductor devices 201 without having to circumvent the connection member. This yields a semiconductor apparatus that is both thin and has improved heat dissipation properties.

However, applying a wire boding method, like used in the first conventional example, to the second conventional example is difficult. This is because in the wire bonding method, the die bonding and wiring are performed while the main surface of the semiconductor device is facing upward, and the wired wires would interfere with the heat dissipating plate. Furthermore, there is concern that the main surface of the semiconductor device will be damaged when the heat dissipating plate applies pressure to the resin encapsulant.

Moreover, since the flip chip method is inferior to the wire bonding method with regard to cost and reliability depending on the specification of the wiring, there are instances when the flip chip method is not applicable.

The present disclosure aims to solve the above problems and achieve a semiconductor apparatus that is compact, thin, has high heat dissipation properties, includes a heat dissipating member, and is manufactured with a wire bonding method.

In order to achieve this, the present disclosure provides a semiconductor apparatus including a heat dissipating plate disposed above a base and a semiconductor device with an encapsulant therebetween, and the heat dissipating plate has a space in a region opposing connection members.

More specifically, a semiconductor apparatus according to one aspect of the present disclosure includes: a base having a main surface on which a terminal is disposed; a first semiconductor device retained on the main surface of the base and having a top surface on which an electrode is disposed and a bottom surface facing the main surface of the base; a connection member connecting the terminal and the electrode; an encapsulant disposed on the main surface of the base and covering the terminal, the first semiconductor device and the connection member; and a heat dissipating member disposed on the encapsulant and having a space that opens in a direction extending perpendicular to the main surface of the base. The encapsulant is disposed in the space and, in a side view of the base, a peak of the connection member is located inside the space.

A semiconductor apparatus according to another aspect of the present disclosure includes a base having a main surface on which a terminal is disposed; a heat dissipating member disposed on the main surface of the base, in a region excluding the terminal; a first semiconductor device retained on the heat dissipating member and having a top surface on which an electrode is disposed; a connection member connecting the terminal and the electrode; and an encapsulant disposed on the main surface of the base and covering the terminal, the first semiconductor device and the connection member. The heat dissipating member has a top surface that, excluding a region on the base in which the connection member is disposed, is higher than a peak of the connection member.

With the semiconductor apparatus according to the present disclosure, a compact, thin semiconductor apparatus including a heat dissipating member and having high heat dissipation properties and high mass productivity can be achieved.

DETAILED DESCRIPTION OF THE PREFERRED EMBODIMENTS

Hereinafter, the semiconductor apparatus according to the present disclosure will be described with reference to the Drawings. Note, however, that detailed descriptions may be omitted. For example, detailed descriptions of well known aspects or repetitive descriptions of essentially similar structures may be omitted. This is to avoid redundancy and make the following description easier for those skilled in the art to comprehend.

Note that the accompanying Drawings and the following description are to aid those skilled in the art in adequately comprehending the present disclosure, and are not intended to limit scope of the claims.

Embodiment 1

Figure 1A:
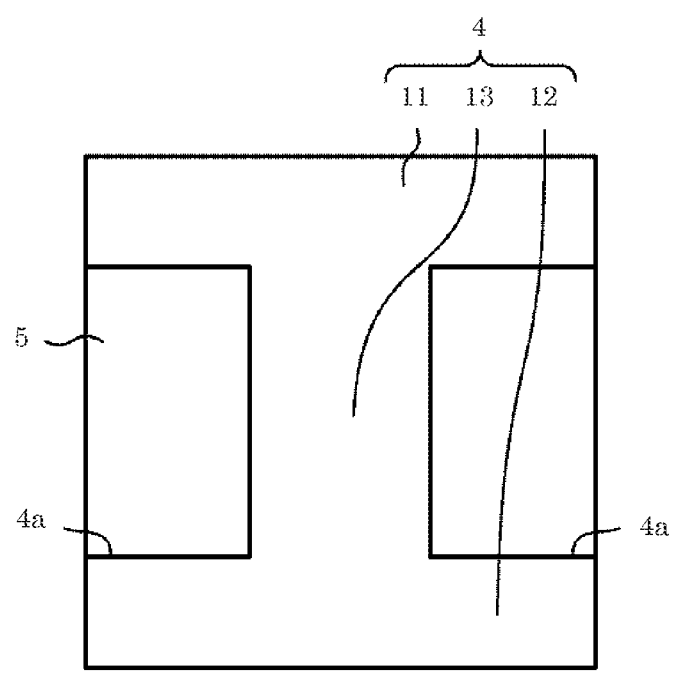
FIG. 1A is a schematic plan view of a semiconductor apparatus according to Embodiment 1.
Figure 1B:
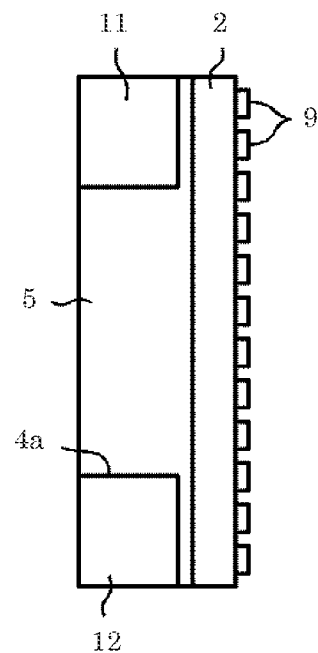
FIG. 1B is a schematic front view of a semiconductor apparatus according to Embodiment 1.
Figure 1C:
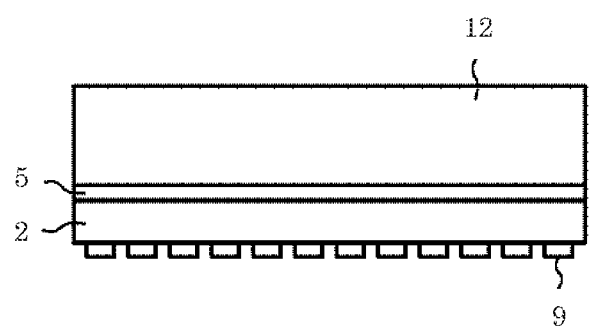
FIG. 1C is a schematic view of a right side of a semiconductor apparatus according to Embodiment 1.

Here, the semiconductor apparatus according to Embodiment 1 will be described with reference to FIG. 1A through FIG. 1C and FIG. 2A through FIG. 2C. FIG. 1A is a schematic plan view of the semiconductor apparatus according to Embodiment 1. FIG. 1B is a schematic front view of the same semiconductor apparatus. FIG. 1C is a schematic view of the right side of the same semiconductor apparatus. Note that FIG. 1B is a view from the right side surface of the semiconductor apparatus illustrated in FIG. 1A, and FIG. 1C is a view from the top side surface of the semiconductor apparatus illustrated in FIG. 1A.

Figure 2A:
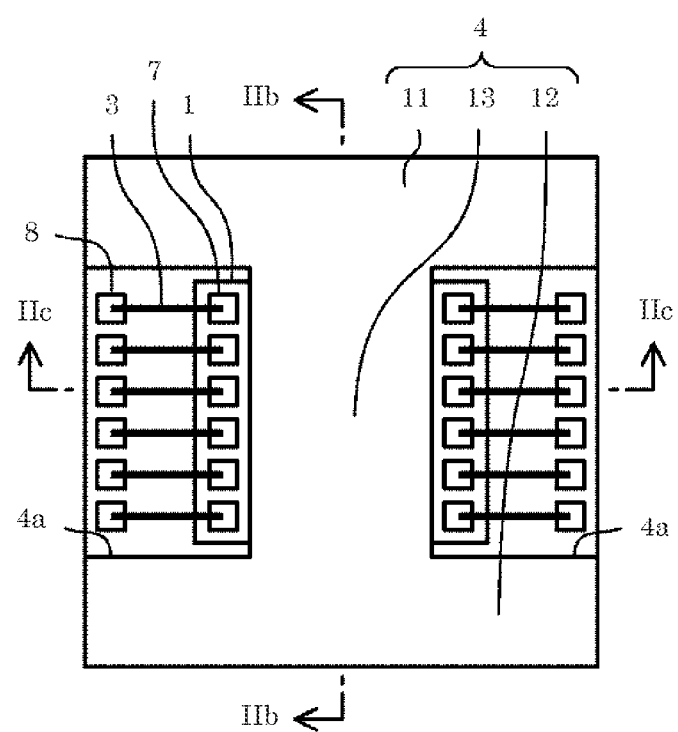
FIG. 2A is a schematic plan view of a semiconductor apparatus according to Embodiment 1, when the encapsulant in FIG. 1A is transparent.
Figure 2B:
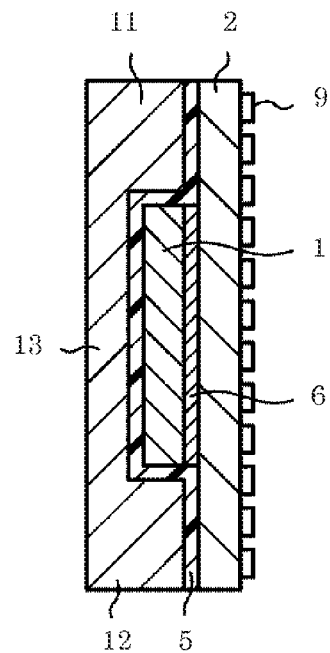
FIG. 2B is a schematic cross sectional view of a semiconductor apparatus according to Embodiment 1, taken at line IIb-IIb in FIG. 2A.
Figure 2C:
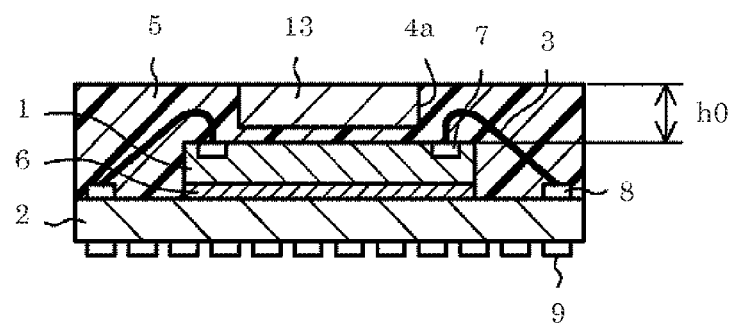
FIG. 2C is a schematic cross sectional view of a semiconductor apparatus according to Embodiment 1, taken at line IIc-IIc in FIG. 2A.

FIG. 2A is a schematic plan view of the semiconductor apparatus according to Embodiment 1, when the encapsulant in FIG. 1A is transparent. FIG. 2B is a cross sectional view of the semiconductor apparatus taken at line IIb-IIb in FIG. 2A. FIG. 2C is a cross sectional view of the semiconductor apparatus taken at line IIc-IIc in FIG. 2A.

As illustrated in FIG. 2A through FIG. 2C, the semiconductor apparatus according to Embodiment 1 includes base 2 and semiconductor device 1. A plurality of internal terminals 8 are disposed on the main surface of base 2. Semiconductor device 1 is fixed and retained on the main surface of base 2 via adhesive layer 6. A plurality of electrodes 7 are disposed on the top surface of semiconductor device 1. The bottom surface of semiconductor device 1 faces the main surface of base 2. Base 2 is, for example, a wiring substrate including a base material on which a wiring layer is formed. Adhesive layer 6 is, for example, die bonding paste. The plurality of internal terminals 8 of base 2 are connected to the plurality of electrodes 7 of semiconductor device 1 via connection members 3. Connection members 3 are, for example, wires mainly made of copper (Cu) or gold (Au). Encapsulant 5 is formed on the main surface of base 2 and integrally covers the plurality of internal terminals 8, semiconductor device 1, and the plurality of connection members 3. A plurality of external terminals 9 are disposed on the rear surface of base 2, which is opposite the main surface of base 2.

The plurality of electrodes 7 are disposed on the top surface of semiconductor device 1, which is the device surface, along two opposing edges of semiconductor device 1.

Heat dissipating member 4 is disposed on encapsulant 5. A metal material such as aluminum (Al) or copper (Cu), or an alloy thereof, for example, may be used for heat dissipating member 4. The exposed surface of heat dissipating member 4 may have a planar plate-like shape, for example. Notched sections 4a are formed in heat dissipating member 4, in the regions above internal terminals 8, connection members 3, and electrodes 7. Each notched section 4a is filled with encapsulant 5. Note that in FIG. 2A, each notched section 4a defines a region surrounded by heat dissipating member 4 on three sides. This region defines a space; that is to say, heat dissipating member 4 has a space that opens in a direction extending perpendicular to the main surface of base 2. Encapsulant 5 fills this space. Moreover, in FIG. 2A, notched section 4a exposes a region from where connection members 3 are disposed to a side surface of encapsulant 5.

More specifically, as illustrated in FIG. 1A and FIG. 2A, heat dissipating member 4 has an H-shape in a plan view and includes first block 11, second block 12, and third block 13. First block 11 and second block 12 have shapes that extend along two opposing sides of semiconductor device 1 at which electrodes 7 in semiconductor device 1 are not disposed. Third block 13 is disposed above semiconductor device 1 and connects first block 11 and second block 12 together. Third block 13 covers the region above semiconductor device 1. With this planar configuration, electrodes 7 of semiconductor device 1, internal terminals 8 of base 2, and connection members 3 are disposed below notched section 4a of heat dissipating member 4. Moreover, as illustrated in FIG. 2A and FIG. 2C, in a side view of base 2, the peak of each connection member 3 is located within the region that is to say, the space defined by notched section 4a.

In this way, with the semiconductor apparatus according to Embodiment 1, since heat dissipating member 4 includes notched section 4a directly above the region in which connection members 3 are disposed, heat dissipating member 4 does not interfere with connection members 3. Thus, even with semiconductor apparatuses in which connection members 3 such as wires are connected with the wire bonding method, heat dissipating member 4 can be disposed close to semiconductor device 1. Moreover, third block 13 can overlap the entire region of semiconductor device 1 excluding the region in which connection members 3 are disposed.

With this configuration, the semiconductor apparatus according to Embodiment 1 can be made thinner than conventional semiconductor apparatuses and have drastically improved heat conductivity to heat dissipating member 4.

Note that with the semiconductor apparatus according to Embodiment 1, third block 13 included in heat dissipating member 4 and disposed above semiconductor device 1 is preferably thinner than first block 11 and second block 12. Accordingly, as illustrated in FIG. 2B, the top surface of semiconductor device 1 and third block can be brought close together and fixed, and the main surface of base 2 and first block 11 and second block 12 can be brought close together and fixed, making it possible to easily achieve a thin semiconductor apparatus. Here, by making the thickness of third block 13 thinner than first block 11 and second block 12 by roughly the thickness of semiconductor device 1, semiconductor device 1 and heat dissipating member 4 can be disposed closer to each other. Moreover, by forming third block 13 to be thinner than roughly the thickness of encapsulant 5—that is, the height from the top surface of semiconductor device 1 to the top surface of encapsulant 5 (thickness h0 in FIG. 2C)—the semiconductor apparatus including heat dissipating member 4 can be made to have a thickness that is equal to the thickness of the semiconductor apparatus when heat dissipating member 4 is omitted.

Note that in the above description, encapsulant 5 is filled in the gaps between first block 11 and base 2, second block 12 and base 2, and third block 12 and semiconductor device 1, but a configuration in which encapsulant 5 is not filled in these gaps and heat dissipating member 4 is in direct contact with base 2 and/or semiconductor device 1 is acceptable.

Moreover, as illustrated in FIG. 1A through FIG. 1C, heat dissipating member 4 is preferably installed in the semiconductor apparatus by being embedded in encapsulant 5, and the top and side surfaces of heat dissipating member 4 preferably conform with the external shape of the semiconductor apparatus. In other words, the side surface of heat dissipating member 4, the side surface of encapsulant 5, and the side surface of base 2 preferably lie in the same plane, and the top surface of heat dissipating member 4 and the top surface of encapsulant 5 preferably lie in the same plane. This improves heat dissipation properties since the top and side surfaces of heat dissipating member 4 are exposed, which in turn increases the reliability of the semiconductor apparatus. Moreover, advantages such as an increase in strength and reduction in warpage of the semiconductor apparatus can be expected.

Moreover, encapsulant 5 may have a thickness that is at least tens of micrometers thicker than the height of the peak of connection members 3—that is to say, than the wire loop height—so that after encapsulant 5 is formed, connection members 3 are not exposed from the surface of encapsulant 5. This prevents electrical shorts resulting from connection member 3 contacting a component external to the semiconductor apparatus, and thereby increases the reliability of the semiconductor apparatus.

Note that the shape of heat dissipating member 4 is not limited to an H-shape in a plan view; so long as notched section 4a which does not interfere with the region in which connection members 3 are disposed is provided, heat dissipating member 4 achieves the same function even with a different plan view shape.

Method of Manufacturing the Semiconductor Apparatus According to Embodiment 1

Next, the method of manufacturing the semiconductor apparatus according to Embodiment 1 will be described with reference to FIG. 3 through FIG. 8, (a) through (f) in FIG. 9, and (a) through (f) in FIG. 10. FIG. 3 through FIG. 8 are plan views corresponding to FIG. 1A, illustrating the sequence of manufacturing processes of the semiconductor apparatus according to Embodiment 1. In FIG. 9, (a) through (f) are cross sectional views corresponding to FIG. 2C, illustrating the sequence of manufacturing processes of the same semiconductor apparatus. In FIG. 10, (a) through (f) are cross sectional views corresponding to FIG. 2B, illustrating the sequence of manufacturing processes of the same semiconductor apparatus. Here, (a) through (f) each illustrate a manufacturing process. (a) corresponds to FIG. 3, (b) corresponds to FIG. 4, (c) corresponds to FIG. 5, (d) corresponds to FIG. 6, (e) corresponds to FIG. 7, and (f) corresponds to FIG. 8.

In order to increase mass productivity, the method of manufacturing the semiconductor apparatus according to Embodiment 1 includes collectively attaching heat dissipating member frame 15 to base frame 18 disposed in a matrix in a region in which a plurality of semiconductor apparatuses are to be formed, collectively encapsulating these with encapsulant 5, and then separating the semiconductor apparatuses into individual units.

Figure 3:
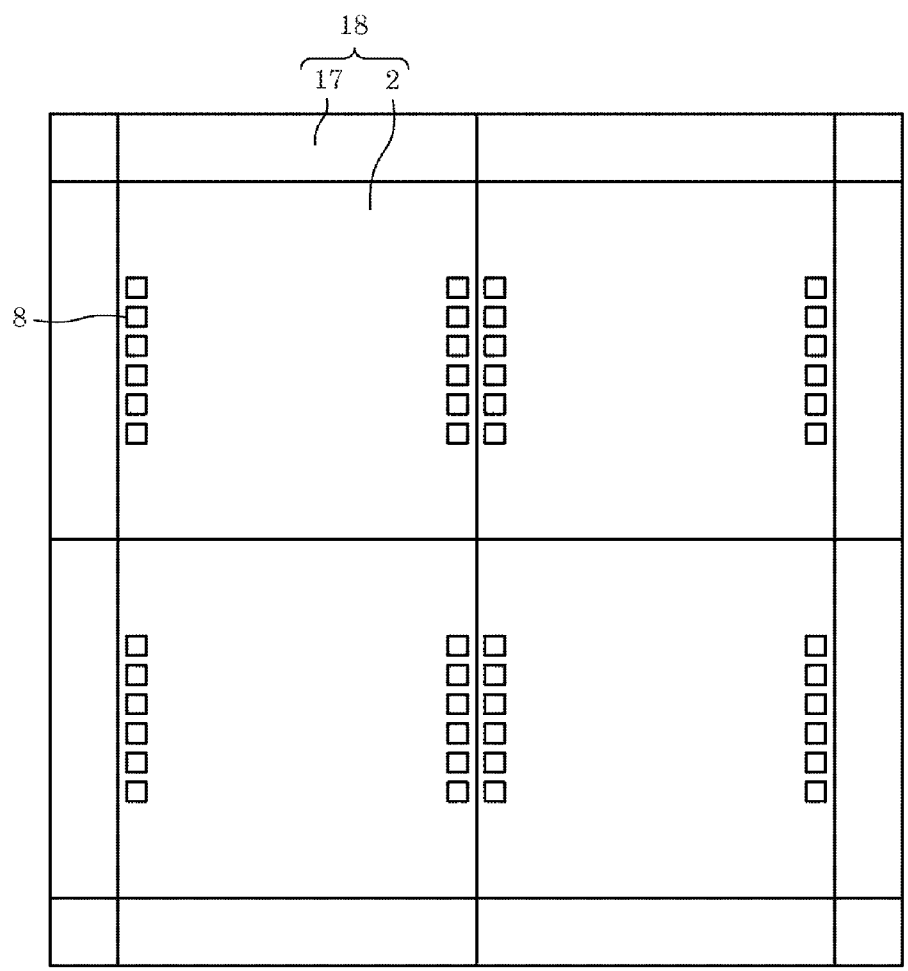
FIG. 3 is a schematic plan view of a process in a method of manufacturing a semiconductor apparatus according to Embodiment 1.

First, as illustrated in FIG. 3, (a) in FIG. 9, and (a) in FIG. 10, base frame 18 used in the present manufacturing method is prepared.

Base frame 18 includes a plurality of bases 2 and base outer frame 17 which retains the plurality of bases 2. A plurality of internal terminals 8 are disposed on the main surface of each base 2, along two opposing edges of base 2. Moreover, a plurality of external terminals 9 are disposed on the rear surface of each base 2.

Copper lines are formed on both the main surface and the rear surface of base 2, and the main surface and rear surface are connected via a through-hole (not shown in the Drawings). Surfaces of internal terminals 8 and external terminals 9 are nickel (Ni)/gold (Au) plated for preservation. Here, the arrangement of the matrix of bases 2 can be determined arbitrarily based on the base size in accord with the size of the product and the manufacturing line. For the sake of succinctness, in Embodiment 1, four base frames 18 are arranged in a two by two matrix.

Figure 4:
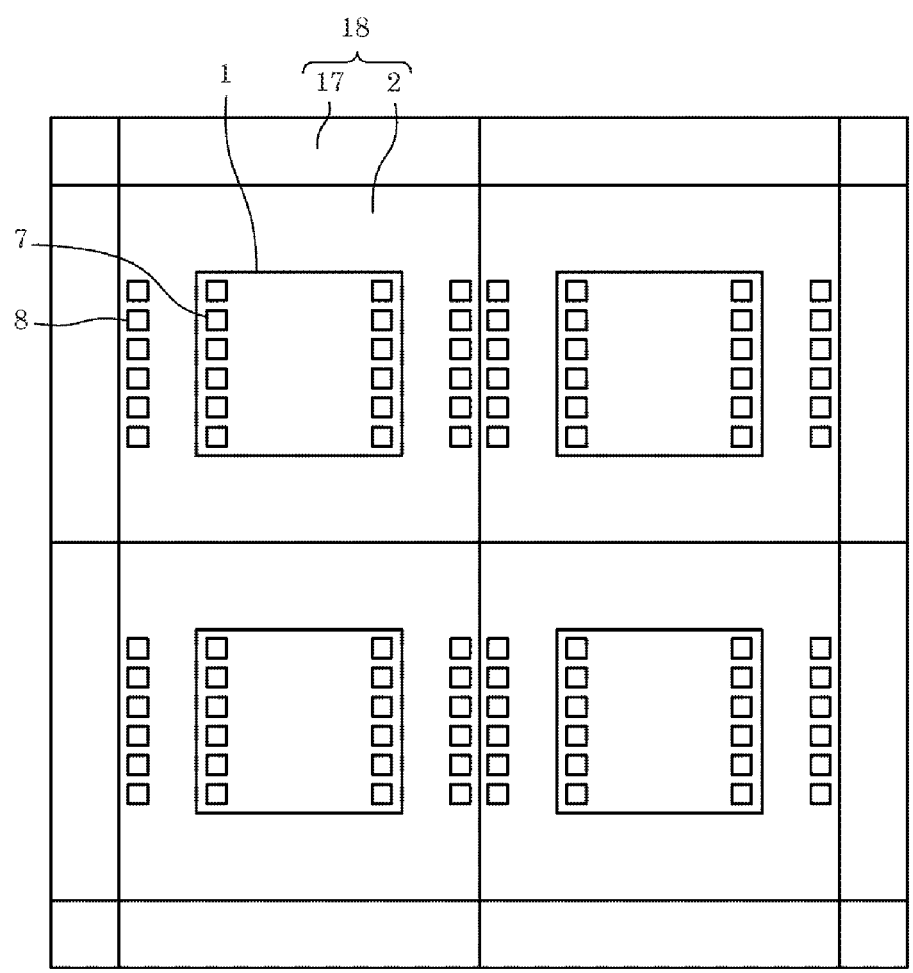
FIG. 4 is a schematic plan view of a process in a method of manufacturing a semiconductor apparatus according to Embodiment 1.

Next, as illustrated in FIG. 4, (b) in FIG. 9, and (b) in FIG. 10, semiconductor device 1 is mounted in a predetermined region of each base 2. The top surface of semiconductor device 1 includes a plurality of electrodes 7. Semiconductor device 1 is oriented such that its rear surface faces the main surface of base 2, and then fixed to base 2 via adhesive layer 6. Here, when mounting semiconductor device 1, semiconductor device 1 is oriented such that the two rows of electrodes 7 on semiconductor device 1 oppose the two rows of internal terminals 8 on base 2.

Semiconductor device 1 is made from, for example, silicon (Si). Electrode 7 is made from, for example, aluminum (Al). Adhesive layer 6 is, for example, a die bonding paste including a glass epoxy resin, and contains a filler (not shown in the Drawings).

Figure 5:
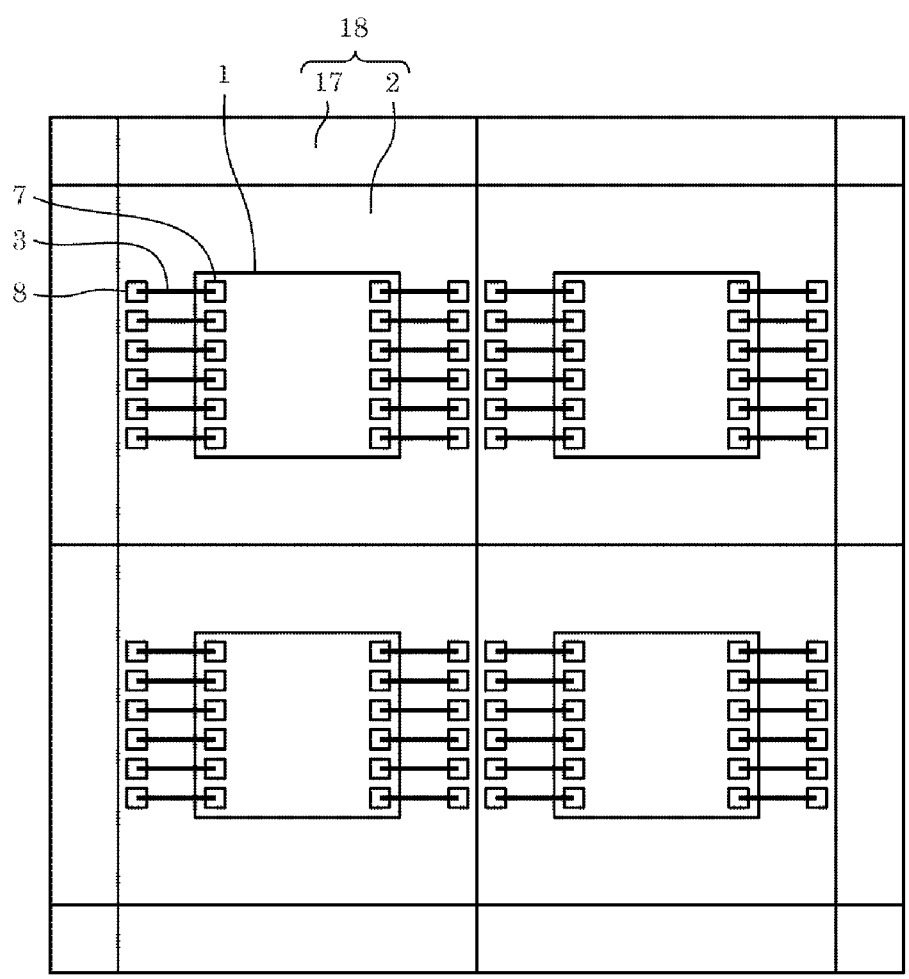
FIG. 5 is a schematic plan view of a process in a method of manufacturing a semiconductor apparatus according to Embodiment 1.

Next, as illustrated in FIG. 5, (c) in FIG. 9, and (c) in FIG. 10, each opposing pair of electrode 7 on semiconductor device 1 and internal terminal 8 on base 2 is connected via connection member 3. Gold (Au) wires, for example, are used as connection members 3.

Figure 6:
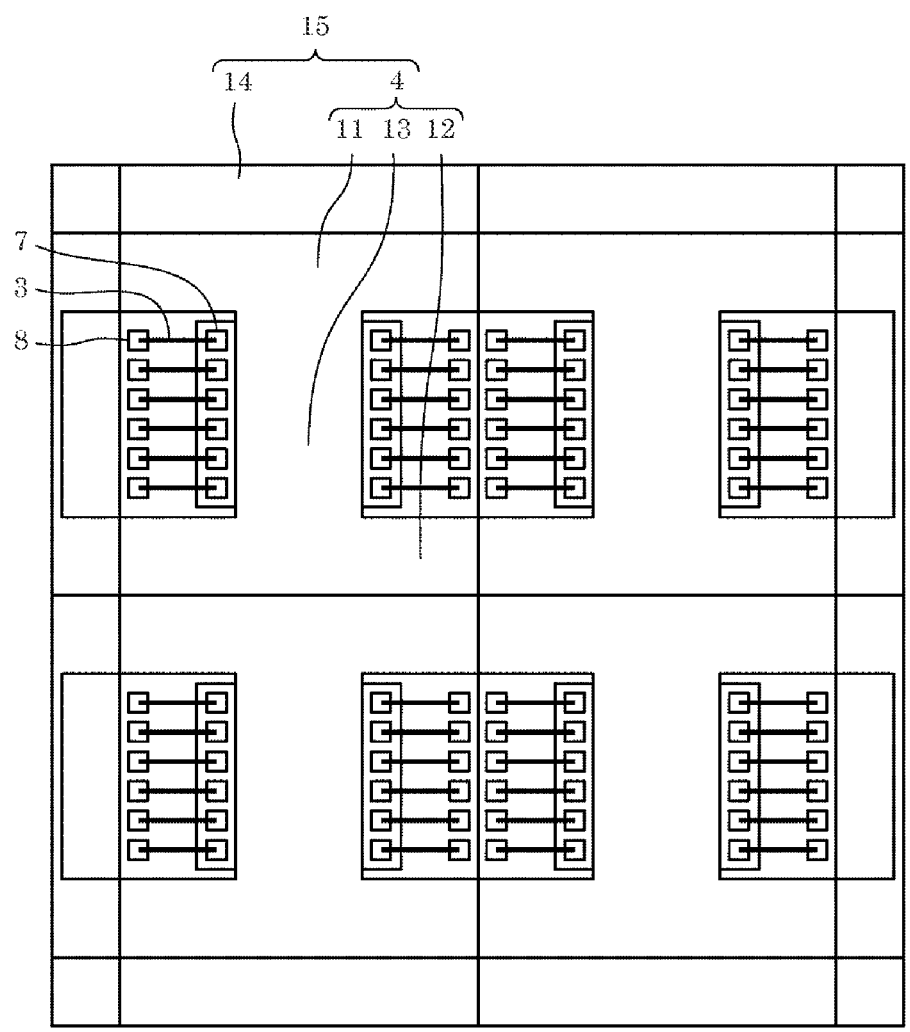
FIG. 6 is a schematic plan view of a process in a method of manufacturing a semiconductor apparatus according to Embodiment 1.

Next, as illustrated in FIG. 6, (d) in FIG. 9, and (d) in FIG. 10, while a separately prepared heat dissipating member frame 15 is aligned with a predetermined position on base frame 18, encapsulant 5 is filled in the gaps between heat dissipating member frame 15 and semiconductor device 1, and between heat dissipating member frame 15 and base frame 18. Then, encapsulant 5 hardens to encapsulate base frame 18, a plurality of semiconductor devices 1 including connection members 3, and heat dissipating member frame 15 into an integral unit. A thermosetting glass epoxy, for example, is used for encapsulant 5. Note that heat dissipating member frame 15 includes a plurality of heat dissipating members 4 and heat dissipating member outer frame 14 that retains outer portions of the plurality of heat dissipating members 4.

Here, in order to increase the heat dissipation effectiveness of heat dissipating member 4, the gaps between heat dissipating member 4 and semiconductor device 1 and between heat dissipating member 4 and base 2 are preferably reduced. However, the narrower the gaps are, the more difficult it is for encapsulant 5 to flow upon performing the collective molding, making injection of encapsulant 5 more difficult. In other words, with a typical transfer molding method, encapsulation may be problematic. This tendency increases as the size of base 2 and number of rows and columns in the matrix increases.

As such, in Embodiment 1, a compression molding method may be employed in the resin encapsulation process as an alternative manufacturing method, whereby encapsulant 5 can be filled with easy and certainty in the gaps between heat dissipating member 4 and semiconductor device 1 and between heat dissipating member 4 and base 2. This compression molding method will be described in detail later.

Figure 7:
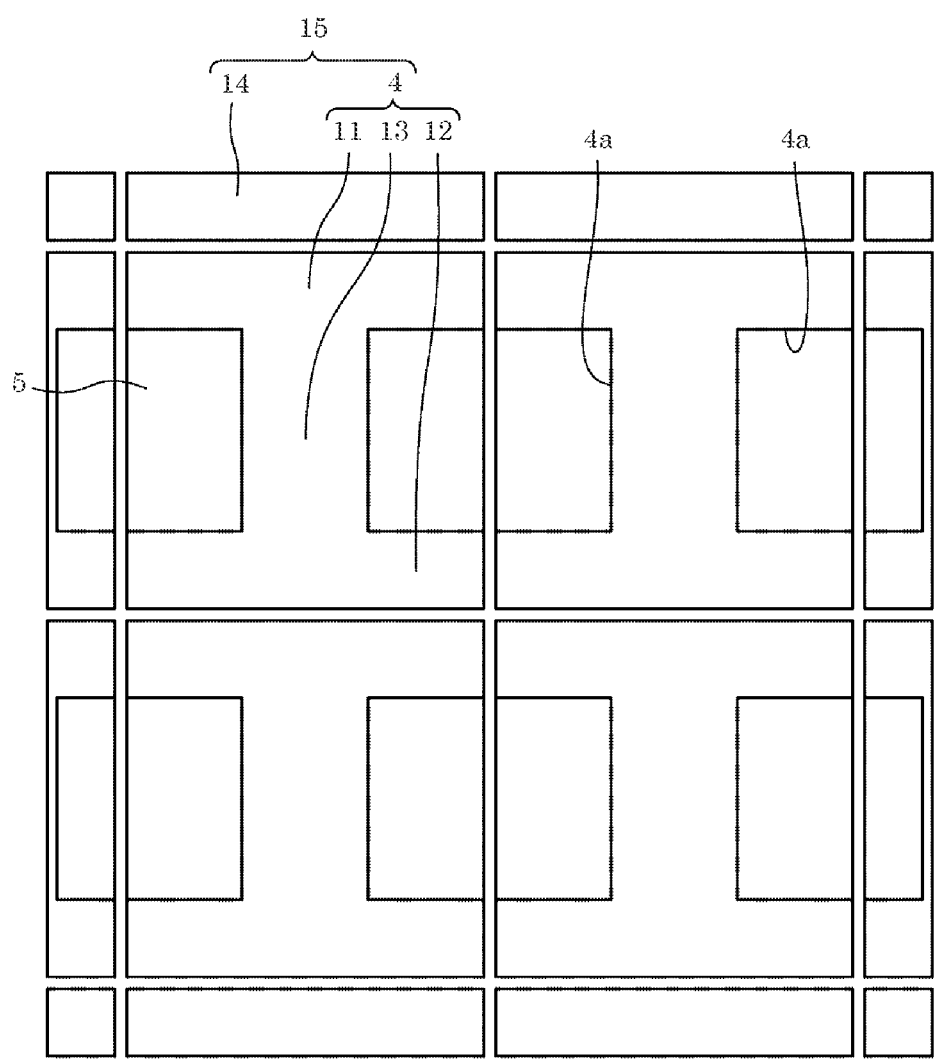
FIG. 7 is a schematic plan view of a process in a method of manufacturing a semiconductor apparatus according to Embodiment 1.

After the encapsulation process, release film 16 is removed from heat dissipating member frame 15, and as illustrated in FIG. 7, (e) in FIG. 9, and (e) in FIG. 10, heat dissipating member fame 15, encapsulant 5, and base frame 18 are diced. Note that release film 16 may be used as a dicing film, in which case dicing is performed before release film 16 is removed.

Figure 8:
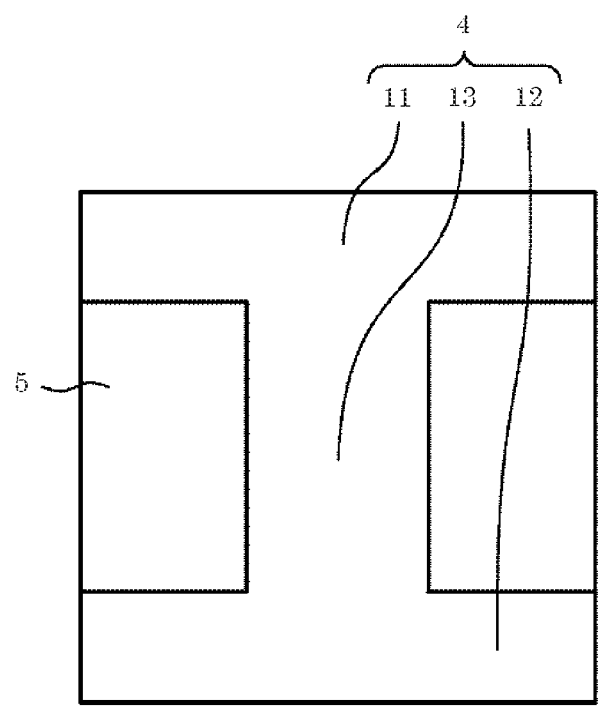
FIG. 8 is a schematic plan view of a process in a method of manufacturing a semiconductor apparatus according to Embodiment 1.
Figure 9:
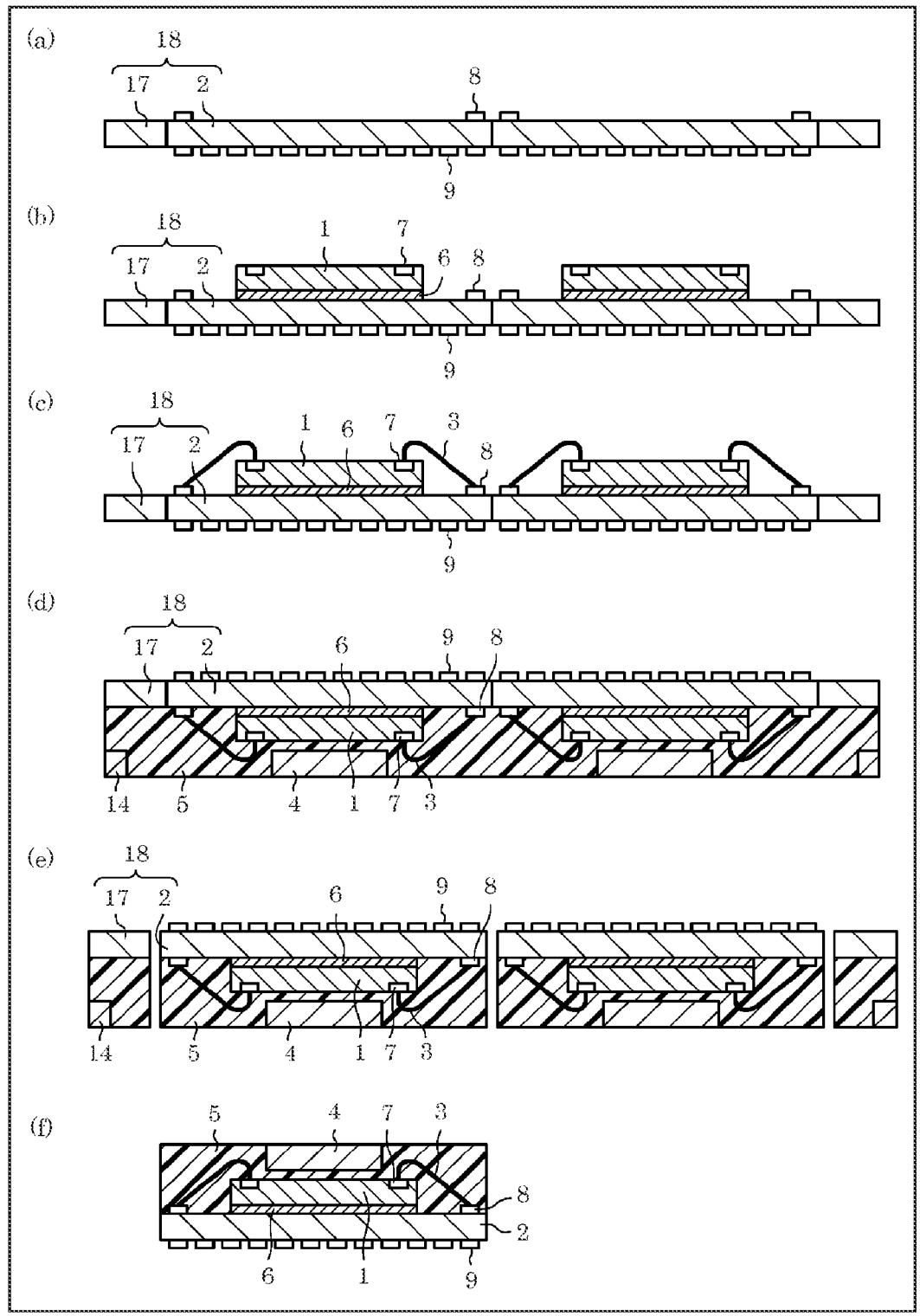
in FIG. 9, (a) through (f) are schematic cross sectional views illustrating a sequence of processes in a method of manufacturing a semiconductor apparatus according to Embodiment 1, taken at line IIc-IIc in FIG. 2A.
Figure 10:
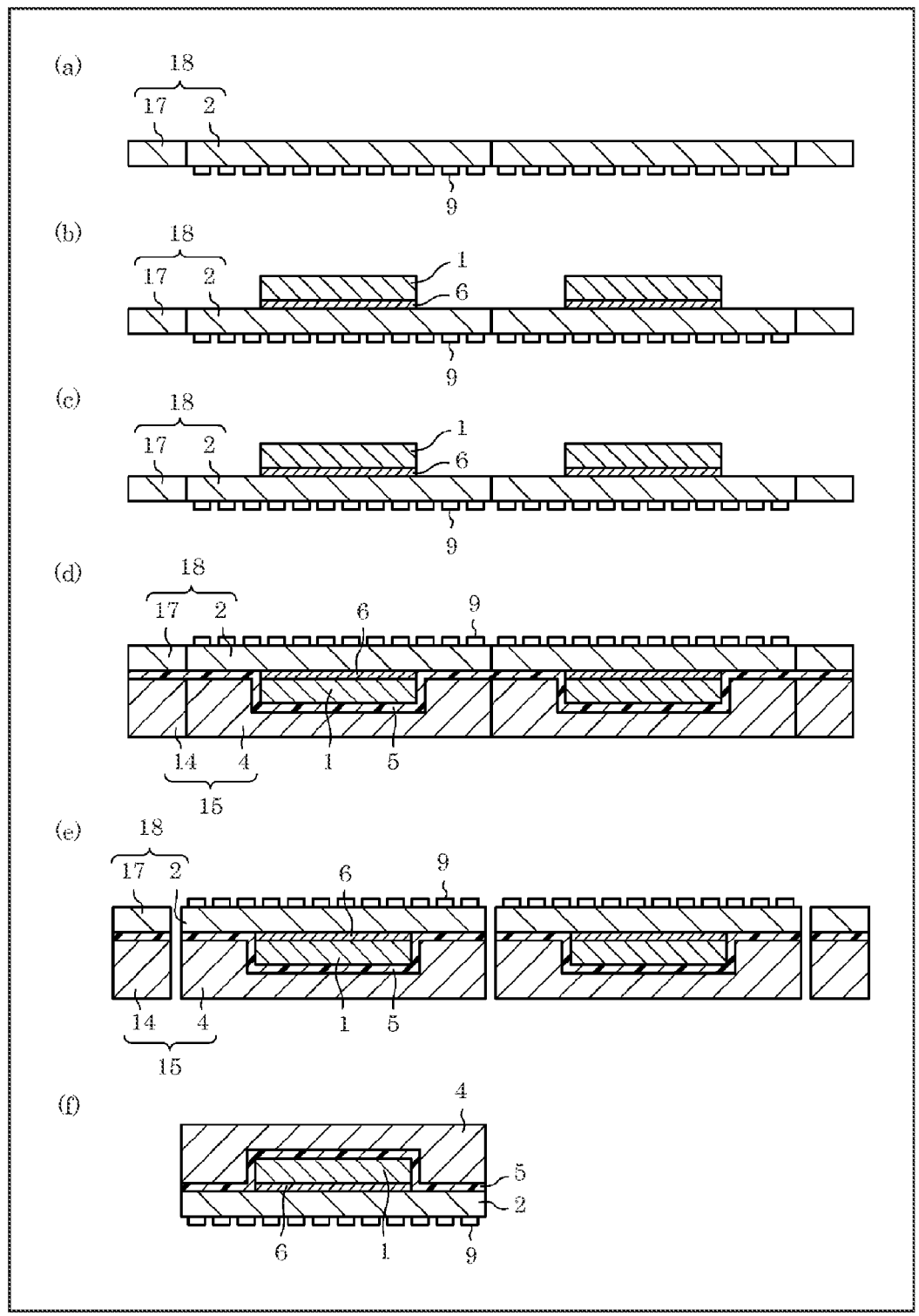
in FIG. 10, (a) through (f) are schematic cross sectional views illustrating a sequence of processes in a method of manufacturing a semiconductor apparatus according to Embodiment 1, taken at line IIb-IIb in FIG. 2A.

As illustrated in FIG. 8, (f) in FIG. 9, and (f) in FIG. 10, individual semiconductor apparatuses are obtained as a result of the dicing. Here, since the semiconductor apparatuses are cut and separated as a result of dicing heat dissipating member 4, the cut surface of heat dissipating member 4 is exposed at the outer edges of the semiconductor apparatuses.

When the plurality of heat dissipating members 4 retained by heat dissipating member outer frame 14 are diced after being encapsulated with the plurality of bases 2 retained by base outer frame 17, misalignment of the dicing may produce uncut remnants on the outer shape of heat dissipating member 4, whereby the cut surface of each individual semiconductor apparatus may differ. However, as illustrated in FIG. 7, by forming heat dissipating member 4 in the semiconductor apparatus according to Embodiment 1 to have, for example, an H-shape in a plan view, cut residual can be inhibited from forming since each edge of the opening defined by the cut notched section 4a is perpendicular relative to the dicing line, and the cut surfaces of each semiconductor apparatus are true.

Note that when each external terminal 9 disposed on the rear surface of base 2 requires a solder ball, the solder balls may be formed at once in a mounting process before the dicing process is performed.

Method of Manufacturing the Semiconductor apparatus According to Embodiment 1 (Employing Compression Molding Method)

Figure 11:
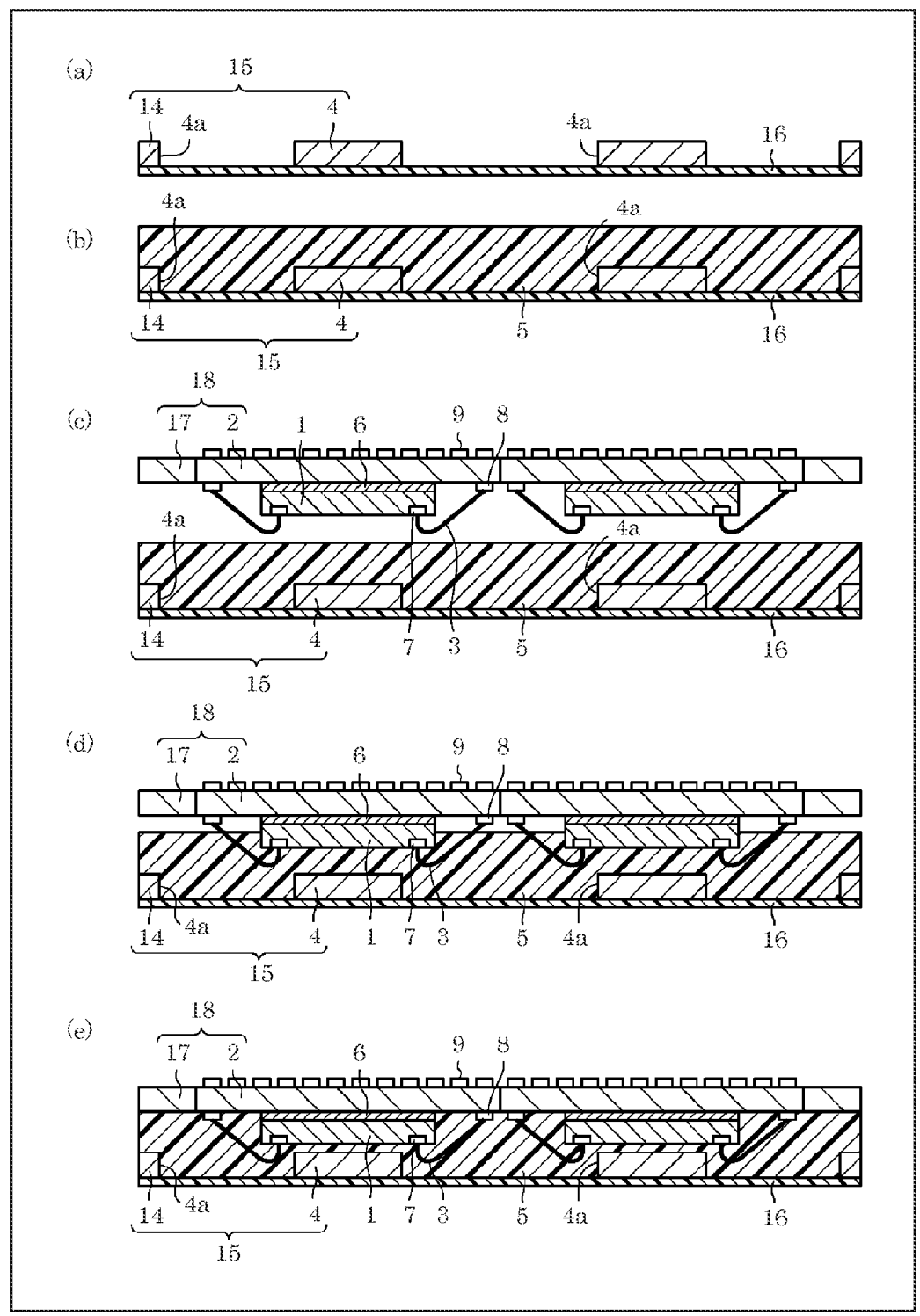
in FIG. 11, (a) through (e) are schematic cross sectional views illustrating a sequence of processes in another method of manufacturing a semiconductor apparatus according to Embodiment 1, taken at line IIc-IIc in FIG. 2A.
Figure 12:
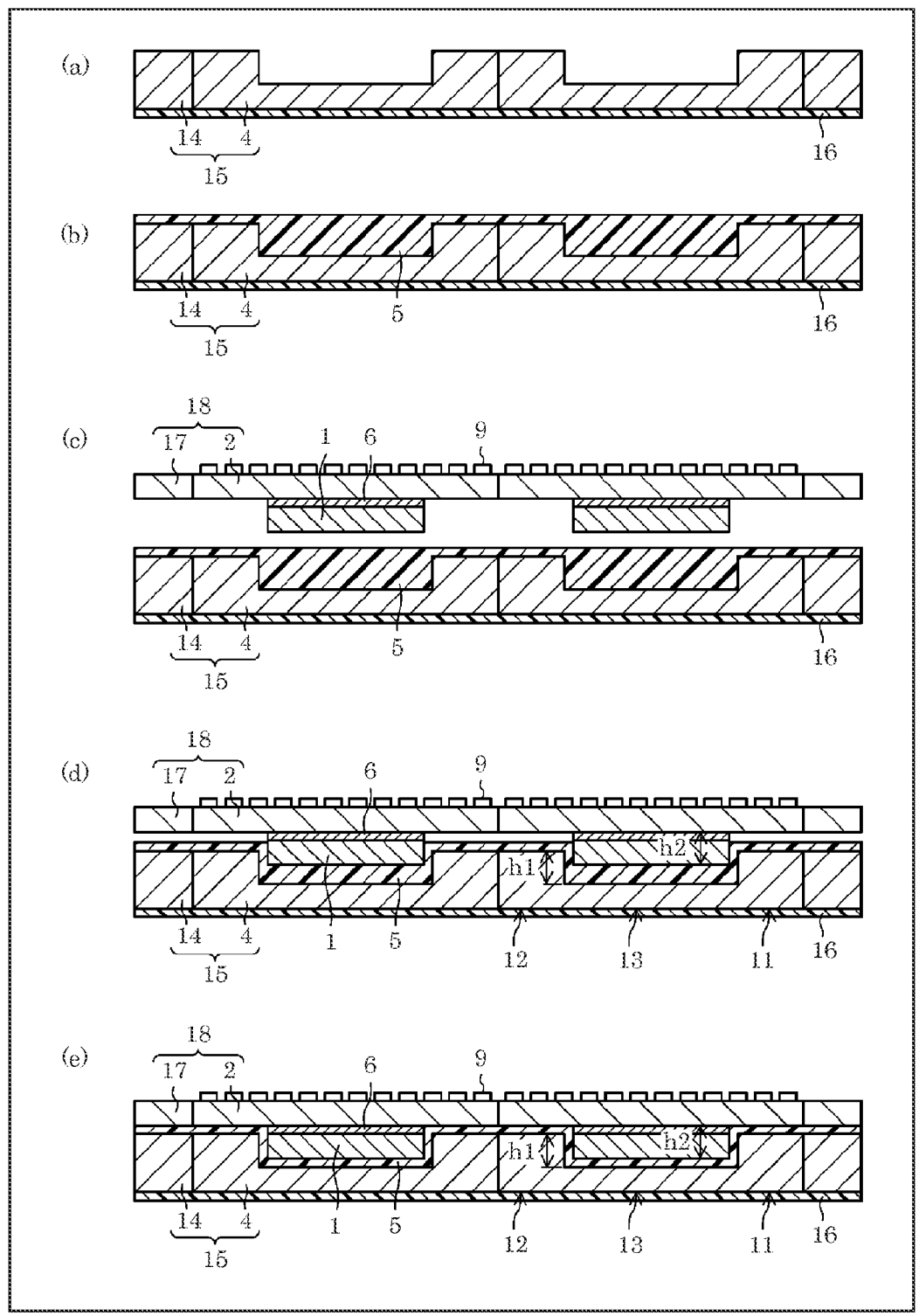
in FIG. 12, (a) through (e) are schematic cross sectional views illustrating a sequence of processes in another method of manufacturing a semiconductor apparatus according to Embodiment 1, taken at line IIb-IIb in FIG. 2A.

The encapsulation process by way of the compression molding method will be described with reference to (a) through (e) in FIG. 11, and (a) through (e) in FIG. 12. In FIG. 11, (a) through (e) are cross sectional views corresponding to FIG. 2C, illustrating the sequence of manufacturing processes. In FIG. 12, (a) through (e) are cross sectional views corresponding to FIG. 2B, illustrating the sequence of manufacturing processes. Note that in FIG. 11 and FIG. 12, (a) through (e) each illustrate a manufacturing process.

Figure 13A:
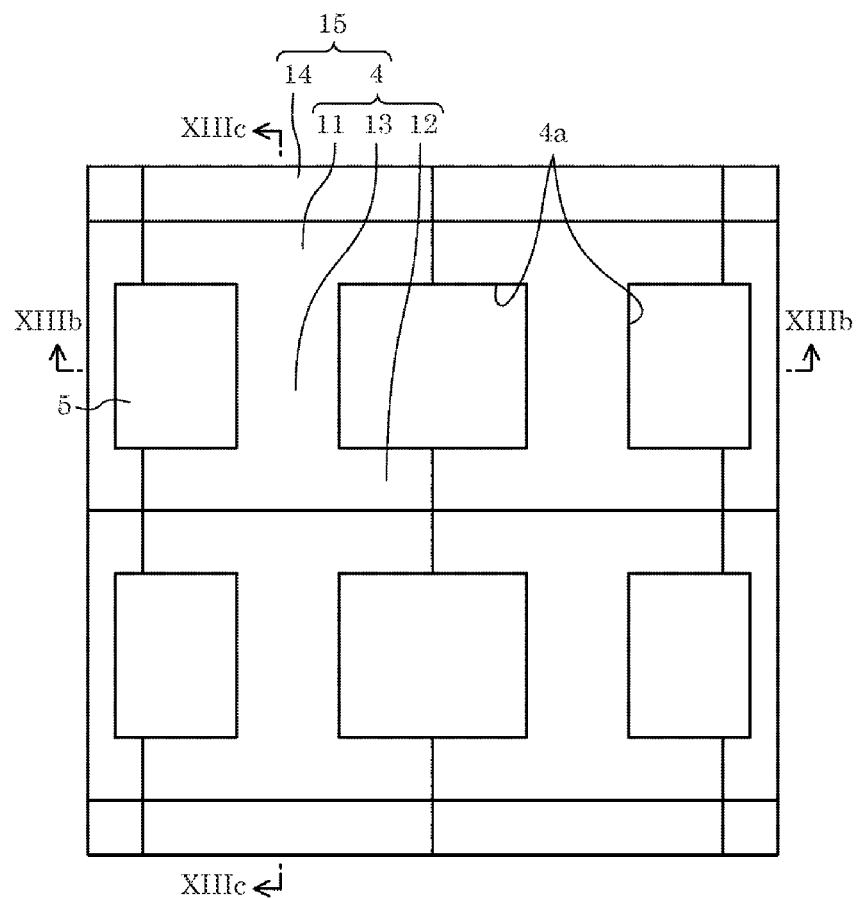
FIG. 13A is a schematic plan view of a heat dissipating member frame used in a manufacturing process of a semiconductor apparatus according to Embodiment 1.
Figure 13B:
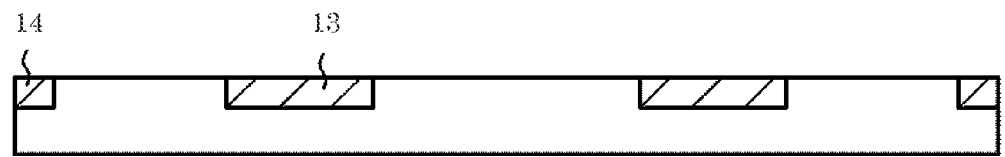
FIG. 13B is a schematic cross sectional view of a heat dissipating member frame used in a manufacturing process of a semiconductor apparatus according to Embodiment 1, taken at line XIIIb-XIIIb in FIG. 13A.
Figure 13C:
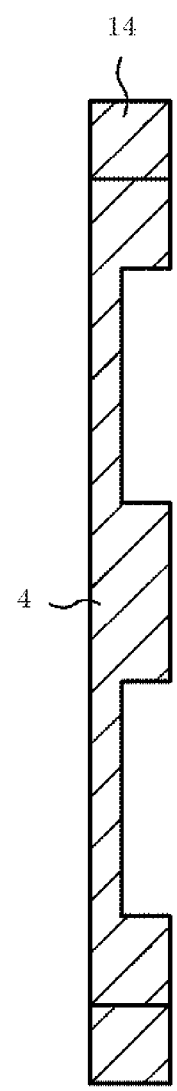
FIG. 13C is a schematic cross sectional view of a heat dissipating member frame used in a manufacturing process of a semiconductor apparatus according to Embodiment 1, taken at line XIIIc-XIIIc in FIG. 13A.

The structure of heat dissipating member frame 15 used in Embodiment 1 is illustrated in FIG. 13A through FIG. 13C. As described above, heat dissipating member frame 15 includes a plurality of heat dissipating members 4 and heat dissipating member outer frame 14 that retains the plurality of heat dissipating members 4. The matrix arrangement of heat dissipating members 4 corresponds to the matrix arrangement of bases 2. Note that FIG. 13B is a cross sectional view of heat dissipating member frame 15 taken at line XIIIb-XIIIb in FIG. 13A, and FIG. 13C is a cross sectional view of heat dissipating member frame 15 taken at line XIIIc-XIIIc in FIG. 13A.

As illustrated in FIG. 13A, in heat dissipating member frame 15, first blocks 11 are connected to one another in the direction of the line XIIIb-XIIIb, second blocks 12 are connected to one another in the direction of the line XIIIb-XIIIb, and first block 11 and second block 12 are connected together in the direction of the line XIIIc-XIIIc, so as to be an integral unit. In this way, in this stage of the manufacturing process, each heat dissipating member 4 is connected to one another. When separated, each notched section 4a is formed as an opening having a quadrilateral shape in a plan view. Moreover, as illustrated in FIG. 13A and FIG. 13C, third block 13 in each heat dissipating member 4 is thinner than first block 11 and second block 12 by roughly the thickness of semiconductor device 1.

First, as illustrated in (a) in FIG. 11 and (a) in FIG. 12, the top surface of heat dissipating member frame 15 is attached to release film 16, which has adhesive properties. After the encapsulation process is complete, release film 16 is removed. A polyimide or Teflon (registered trademark) material, for example, is used as the base material for release film 16, and a material capable of resisting heat of 170 degrees Celsius and higher, such as olefin, is used as the adhesive for release film 16.

Next, as illustrated in (b) in FIG. 11 and (b) in FIG. 12, a layer of liquid encapsulant 5 is coated or printed on heat dissipating member frame 15. Alternatively, a granular encapsulant 5 may be scattered and then heated and melted. For example, a thermosetting material, such as glass epoxy resin, is used for encapsulant 5.

Next, as illustrated in (c) in FIG. 11 and (c) in FIG. 12, semiconductor device 1 is mounted on each base 2, and base frame 18 prepared up until the connection member bonding process is oriented opposing encapsulant 5 on heat dissipating member frame 15 and positioned. Here, positioning is performed such that at least each notched section 4a overlaps the region in which the corresponding connection members 3 are disposed and does not contact heat dissipating member 4.

Next, as illustrated in (d) in FIG. 11 and (d) in FIG. 12, heat dissipating member frame 15 is pressed into base frame 18 with the melted encapsulant 5 therebetween, whereby heat dissipating member frame 15 and base frame 18 are bonded together.

Next, as illustrated in (e) in FIG. 11 and (e) in FIG. 12, pressure is applied to compress (pressure bond) heat dissipating member frame 15 and base frame 18 together. With this, heat dissipating member frame 15, encapsulant 5, each semiconductor device 1, and base frame 18 are integrated as a single unit.

At this time, as illustrated in (d) and (e) in FIG. 11, by positioning the openings (portions where notched section 4a are connected) of heat dissipating member frame 15 relative to the region in which connection members 3 are disposed on base frame 18, interference between each heat dissipating member 4 and each connection member 3 can be avoided.

Note that, as illustrated in (d) and (e) in FIG. 12, the height difference h1 between first block 11 and third block 13 and between second block 12 and third block 13 is preferably greater than the combined thickness h2 of semiconductor device 1 and adhesive layer 6. With this, when heat dissipating member frame 15 and base frame 18 are compressed and bonded together, first block 11 and second block 12 will contact base 2 before third block 13 contacts semiconductor device 1, making it possible to avoid damage to the device surface of semiconductor device 1 caused by interference between third block 13 and semiconductor device 1.

Furthermore, with this configuration, heat dissipating member 4 can be brought into close proximity with the top surface of semiconductor device 1, which is the device surface. Moreover, since the cubic volume of heat dissipating member 4 can be increased in regions other than regions where semiconductor device 1 and connection members 3 are disposed, the heat dissipation effectiveness of heat dissipating member 4 can be increased.

Note that from the viewpoint of heat dissipation effectiveness, the distance between heat dissipating member 4 and semiconductor device 1 is preferably as minimal as possible. However, taking into consideration damage to the device surface of semiconductor device 1, the gap needs to be larger than the size of the filler dispersed in encapsulant 5. In the semiconductor apparatus according to Embodiment 1, since first block 11 and second block 12 included in heat dissipating member 4 function as spacers, as illustrated in (e) in FIG. 12, the distance between semiconductor device 1 and heat dissipating member 4 can be arbitrarily modified.

In practice, taking into consideration the thickness of semiconductor device 1, the thickness of heat dissipating member 4, the parallelism tolerance between semiconductor device 1 and heat dissipating member 4, the size of the filler dispersed in encapsulant 5, and the filling properties of encapsulant 5, the distance between semiconductor device 1 and heat dissipating member 4 is preferably in a range from 50 µm to 100 µm, inclusive.

To reduce the distance between semiconductor device 1 and heat dissipating member 4, the size of the filler dispersed in encapsulant 5 can be decreased, or the filler can be omitted all together. However, using a smaller filler size while maintaining the same dispersal amount increases the viscosity of encapsulant 5 and therefore reduces the flowability of encapsulant 5. Moreover, a low dispersal amount reduces the reliability of encapsulant 5. Thus, the composition of encapsulant 5 may be varied based on the distance between semiconductor device 1 and heat dissipating member 4. For example, one encapsulant may be used in the gap between semiconductor device 1 and heat dissipating member 4 and a different encapsulant may be used in other portions. More specifically, only in the gap between semiconductor device 1 and heat dissipating member 4, encapsulant 5 dispersed with a fine filler or free of filler may be used. In other words, a first encapsulant free of a filler and a second encapsulant containing a filler may be prepared as encapsulant 5. The first encapsulant may fill the gap between semiconductor device 1 and heat dissipating member 4, and the second encapsulant may fill a region excluding the gap between semiconductor device 1 and heat dissipating member 4.

Moreover, by using encapsulant 5 dispersed with metal particles only in the gap between semiconductor device 1 and heat dissipating member 4, which are insulated from each other by encapsulant 5, the heat conductivity of encapsulant 5 can be increased. In other words, a first encapsulant containing a metal and a second encapsulant free of metal may be prepared as encapsulant 5. The first encapsulant may fill the gap between semiconductor device 1 and heat dissipating member 4, and the second encapsulant may fill a region excluding the gap between semiconductor device 1 and heat dissipating member 4.

Moreover, in the manufacturing method according to Embodiment 1, with heat dissipating member frame 15 including a plurality of heat dissipating members 4 and heat dissipating member outer frame 14 retaining the plurality of heat dissipating members 4, the thickness of the semiconductor apparatus can be adjusted. This makes it possible to omit use of a mold cavity. Omitting the use of a mold cavity makes encapsulation using a plate the possible. This eliminates the need to prepare a special die, which increases mass productivity, since the die can be used for other semiconductor apparatuses.

Note that the encapsulation process in the present manufacturing method may use a conventional mold cavity while making sure encapsulant 5 does not leak out of the mold. In this case, since the amount of coated encapsulant 5 used affects the thickness of encapsulant 5, it is necessary to adjust the amount of encapsulant 5 used. However, this does not influence the effectiveness of Embodiment 1 in essence.

Moreover, as illustrated in (d) in FIG. 9 and (d) in FIG. 10, when encapsulant 5 is injected in each opening of heat dissipating member frame 15 after heat dissipating member frame 15 is assembled together with base frame 18, a potting method or printing method can be used.

With either method, heat dissipating member frame 15 and base frame 18 are assembled together with encapsulant 5 interposed therebetween, and then while the above is compressed, encapsulation is completed by thermosetting encapsulant 5.

Note that the encapsulation method is not limited to compression molding. For example, so long as the flow channel for encapsulant 5 can be secured, a typical transfer molding method may be used.

Variation 1 of Embodiment 1

Figure 14A:
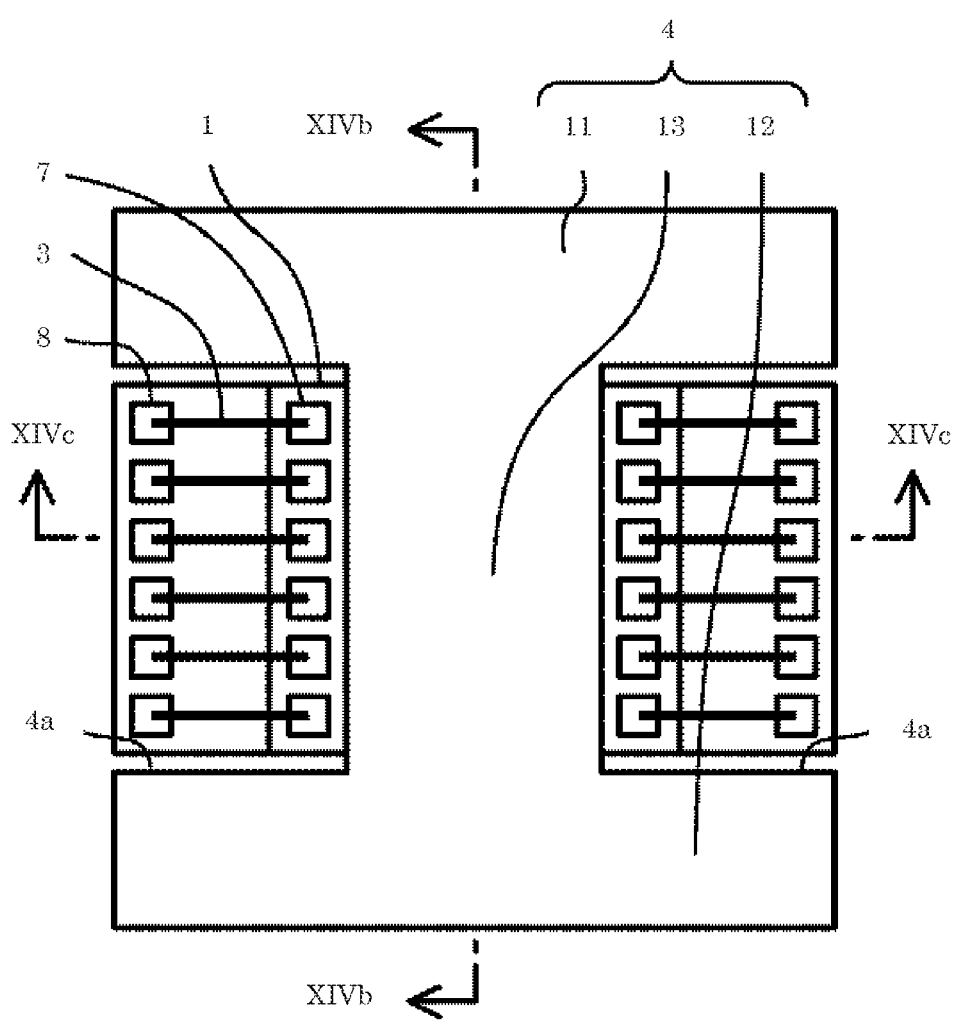
FIG. 14A is a schematic plan view of a semiconductor apparatus according to Variation 1 of Embodiment 1, when the encapsulant is transparent.
Figure 14B:
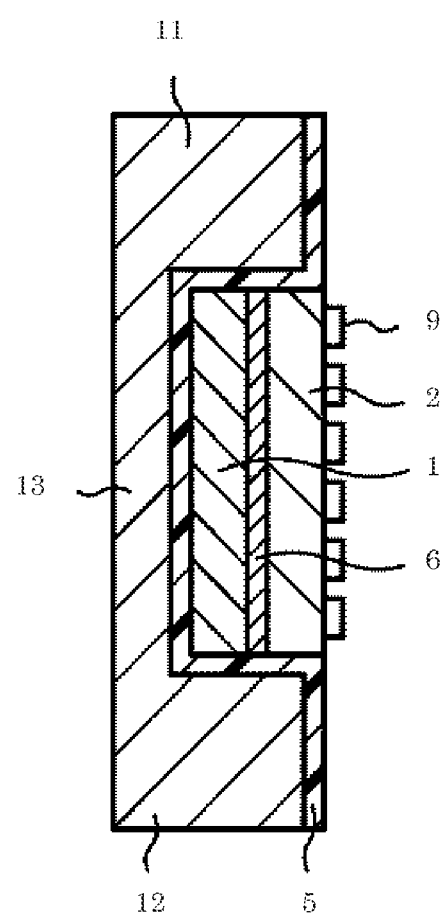
FIG. 14B is a schematic cross sectional view of a semiconductor apparatus according to Variation 1 of Embodiment 1, taken at line XIVb-XIVb in FIG. 14A.
Figure 14C:
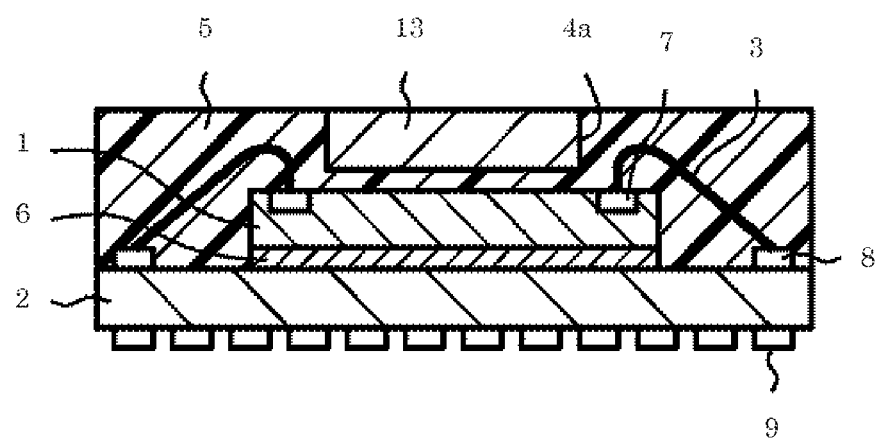
FIG. 14C is a schematic cross sectional view of a semiconductor apparatus according to Variation 1 of Embodiment 1, taken at line XIVc-XIVc in FIG. 14A.

Here, the semiconductor apparatus according to Variation 1 of Embodiment 1 will be described with reference to FIG. 14A through FIG. 14C. Note that FIG. 14A is a schematic plan view of the semiconductor apparatus according to Variation 1 of Embodiment 1, when the encapsulant in FIG. 1A is transparent. FIG. 14B is a cross sectional view of the semiconductor apparatus taken at line XIVb-XIVb in FIG. 14A. FIG. 14C is a cross sectional view of the semiconductor apparatus taken at line XIVc-XIVc in FIG. 14A.

In Variation 1, the plan view shape of heat dissipating member 4 is larger than the plan view shape of base 2, and first block 11 and second block 12 of heat dissipating member 4 are located peripheral to base 2. With this, the surface area and cubic volume of heat dissipating member 4 is increased, thereby increasing heat dissipation effectiveness.

More specifically, as illustrated in FIG. 14A and FIG. 14B, first block 11 and second block 12 of heat dissipating member 4 are disposed along the sides of base 2 at which internal terminals 8 are not disposed, and moreover disposed so as to cover those sides. Moreover, third block 13 is disposed across base 2 so as to bridge the two sides of base 2 at which internal terminals 8 are not disposed. In other words, third block 13 covers an area above base 2, from one side surface of base 2 at which internal terminals 8 are not disposed to the opposing surface. Here, as illustrated in FIG. 14B, the width of base 2 in the direction of line XIVb-XIVb is equal to the width of semiconductor device 1 in the direction of line XIVb-XIVb, but the width of base 2 in the direction of line XIVb-XIVb and the width of semiconductor device 1 in the direction of line XIVb-XIVb are not required to be equal. Note that in heat dissipating member 4, third block 13 is thinner than first block 11 and second block 12.

Figure 15A:
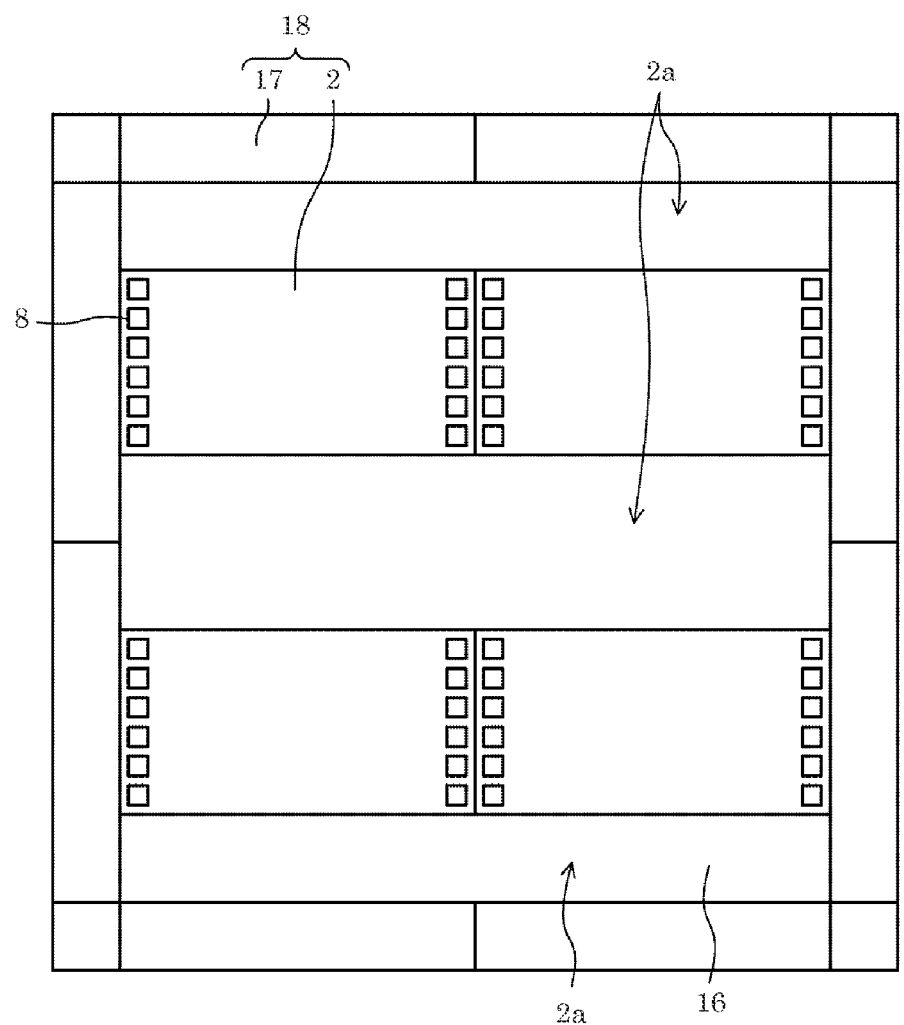
FIG. 15A is a schematic plan view of a base frame used in a manufacturing process of a semiconductor apparatus according to Variation 1 of Embodiment 1.
Figure 15B:
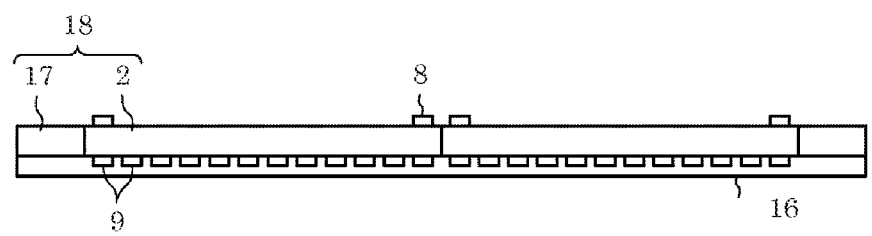
FIG. 15B is a schematic front view of a base frame used in a manufacturing process of a semiconductor apparatus according to Variation 1 of Embodiment 1.

By using base frame 18 illustrated in FIG. 15A and FIG. 15B, the semiconductor apparatus according to Variation 1 can be produced with the same processes as in the manufacturing method according to Embodiment 1 described above.

In other words, the side surfaces of sides at which internal terminals 8 are not disposed of bases 2 arranged in a matrix in base frame 18 according to Variation 1 have slits (openings) 2a. Furthermore, release film 16 is attached to the entire rear surface of base frame 18. With this, each heat dissipating member 4 can be formed to extend outward beyond the side surface of base 2, and leakage of encapsulant 5 to the rear surface of base 2 in the encapsulation process can be prevented.

In this way, according to Variation 1, since first block 11 and second block 12 extend outward beyond the side surfaces of base 2 and heat dissipating member 4 forms the side surfaces excluding the regions in which connection members 3 are disposed, heat dissipation properties can be increased, warpage can be reduced, strength can be increased, and therefore reliability can be increased.

Variation 2 of Embodiment 1

Figure 16A:
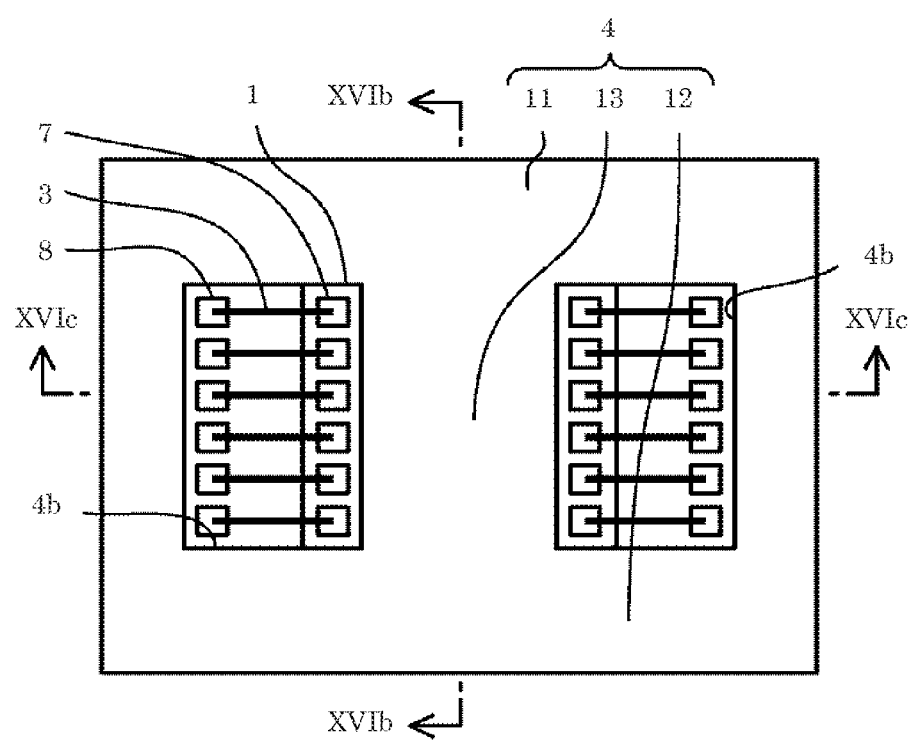
FIG. 16A is a schematic plan view of a semiconductor apparatus according to Variation 2 of Embodiment 1, when the encapsulant is transparent.
Figure 16B:
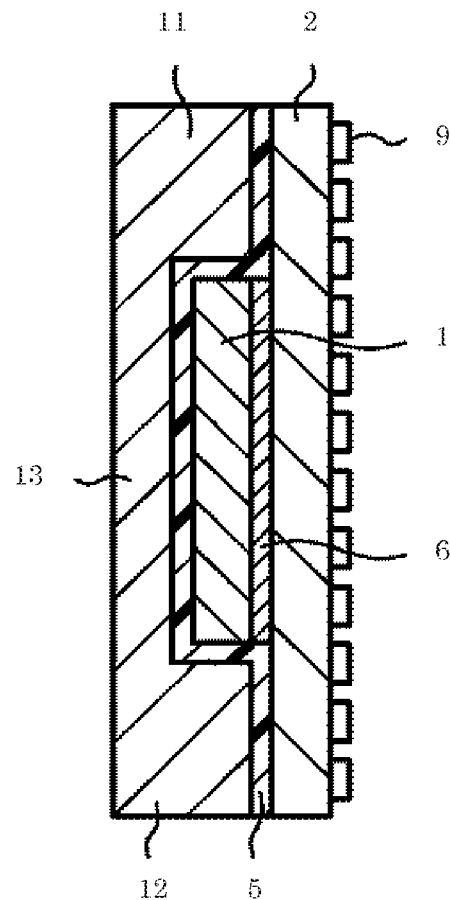
FIG. 16B is a schematic cross sectional view of a semiconductor apparatus according to Variation 2 of Embodiment 1, taken at line XVIb-XVIb in FIG. 16A.
Figure 16C:
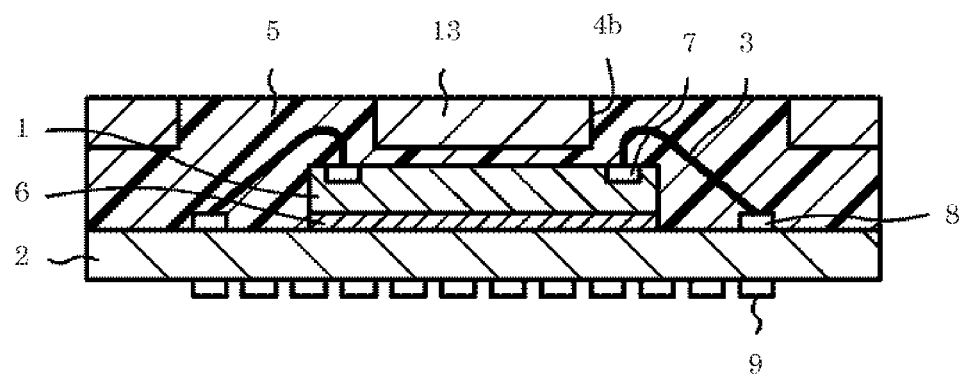
FIG. 16C is a schematic cross sectional view of a semiconductor apparatus according to Variation 2 of Embodiment 1, taken at line XVIc-XVIc in FIG. 16A.

Here, the semiconductor apparatus according to Variation 2 of Embodiment 1 will be described with reference to FIG. 16A through FIG. 16C. Note that FIG. 16A is a schematic plan view of the semiconductor apparatus according to Variation 2 of Embodiment 1, when the encapsulant is transparent. FIG. 16B is a cross sectional view of the semiconductor apparatus taken at line XVIb-XVIb in FIG. 16A. FIG. 16C is a cross sectional view of the semiconductor apparatus taken at line XVIc-XVIc in FIG. 16A.

In Variation 2, the spaces formed in heat dissipating member 4 that prevent interference with the regions in which connection member 3 are disposed are provided as openings 4b instead of notched sections 4a. Each opening 4b is provided above a region in which connection members 3 are disposed. With this configuration, since the side surfaces of heat dissipating member 4 are exposed around the entire perimeter of the semiconductor apparatus, the heat dissipation properties and strength of the semiconductor apparatus increases.

Note that similar to Variation 1, in Variation 2 as well, first block 11 and second block 12 of heat dissipating member 4 may be disposed in a more peripheral position than base 2 and cover side surfaces of sides of base 2 at which internal terminals 8 are not disposed.

Variation of Heat Dissipating Member

Here, a variation of heat dissipating member 4 included in the semiconductor apparatus according to Embodiment 1 and variations thereof will be described.

The plan view shape of each of notched section 4a and opening 4b is not limited to the shapes illustrated in FIG. 1A and FIG. 16A; notched section 4a and opening 4b may have any shape so long as notched section 4a and opening 4b do not interfere with connection members 3. For example, notched section 4a and opening 4b may have the shapes illustrated in FIG. 17A through FIG. 17C.

Figure 17A:
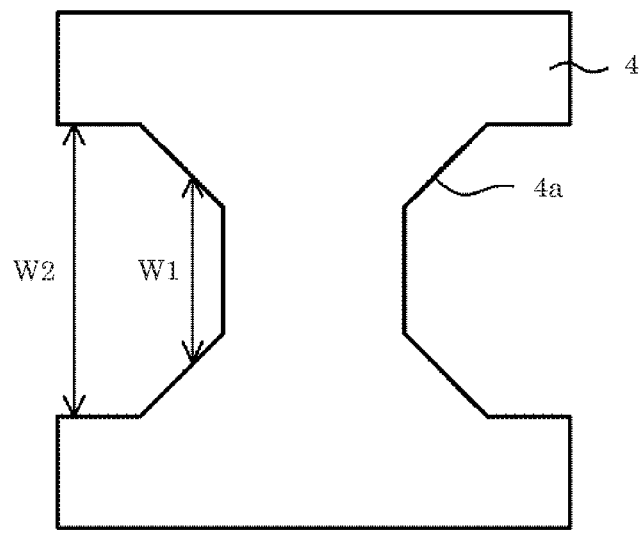
FIG. 17A is a schematic plan view of a variation of a heat dissipating member included in a semiconductor apparatus according to Embodiment 1 and Variation 1.
Figure 17B:
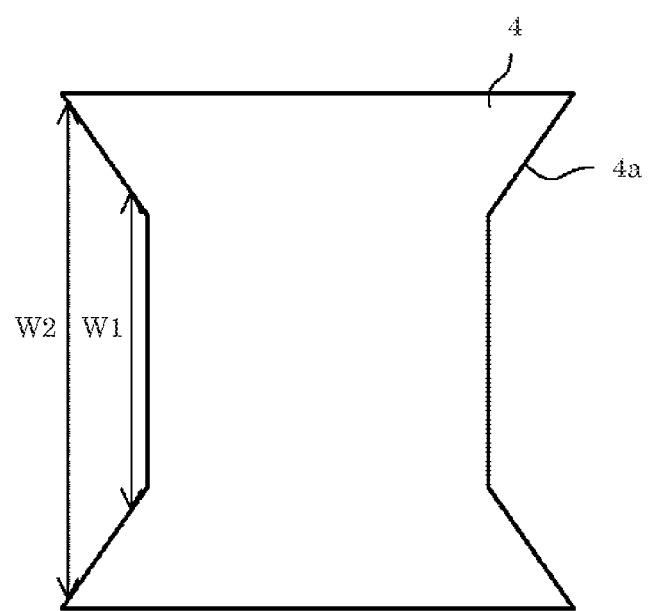
FIG. 17B is a schematic plan view of a variation of a heat dissipating member included in a semiconductor apparatus according to Embodiment 1 and Variation 1.
Figure 17C:
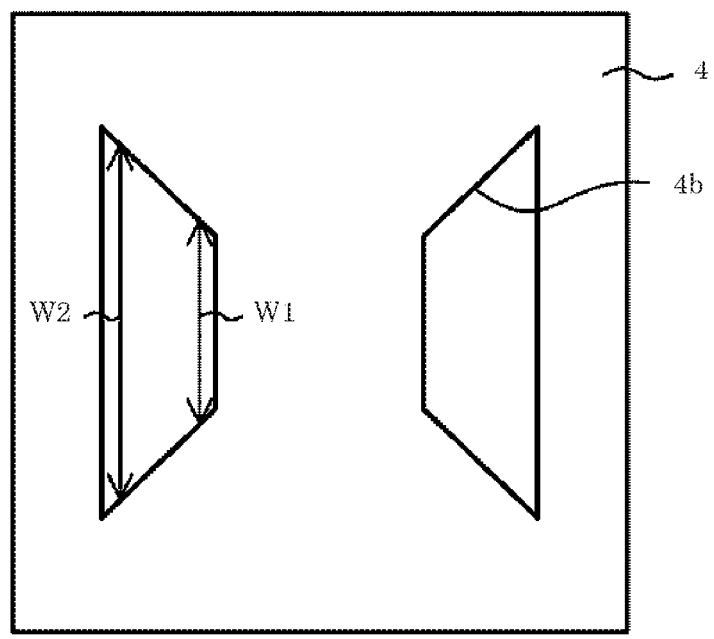
FIG. 17C is a schematic plan view of a variation of a heat dissipating member included in a semiconductor apparatus according to Embodiment 1 and Variation 2.

FIG. 17A and FIG. 17B illustrate a variation of notched section 4a of heat dissipating member 4, and FIG. 17C illustrates a variation of opening 4b of heat dissipating member 4. In FIG. 17A through FIG. 17C, W1 represents the inner width of notched section 4a or opening 4b, and W2 represents the outer width of notched section 4a or opening 4b. In each example, outer width W2 is greater than inner width W1. In other words, FIG. 17B illustrates heat dissipating member 4 whose notched section has a width that, in a plan view, increases from a central region of heat dissipating member 4 outward, and FIG. 17C illustrates heat dissipating member 4 whose opening has a width that, in a plan view, increases from a central region of heat dissipating member 4 outward.

With this configuration, the intervals at which internal terminals 8 disposed on base 2 are spaced apart from each other can be set greater than the intervals at which electrodes 7 disposed on semiconductor device 1 are spaced apart from each other, which makes bonding of the connection members in the wire bonding process easier to perform.

Moreover, notched sections 4a and openings 4b are exemplified as being two symmetrical notched sections 4a or openings 4b that make it easy to demarcate the region in which heat dissipating member 4 is disposed and the region in which connection members 3 are disposed, but depending on the configuration of the region in which connection members 3 are disposed, one notched section 4a or opening 4b, or three or more notched sections 4a or openings 4b may be provided.

Embodiment 2

Figure 18A:
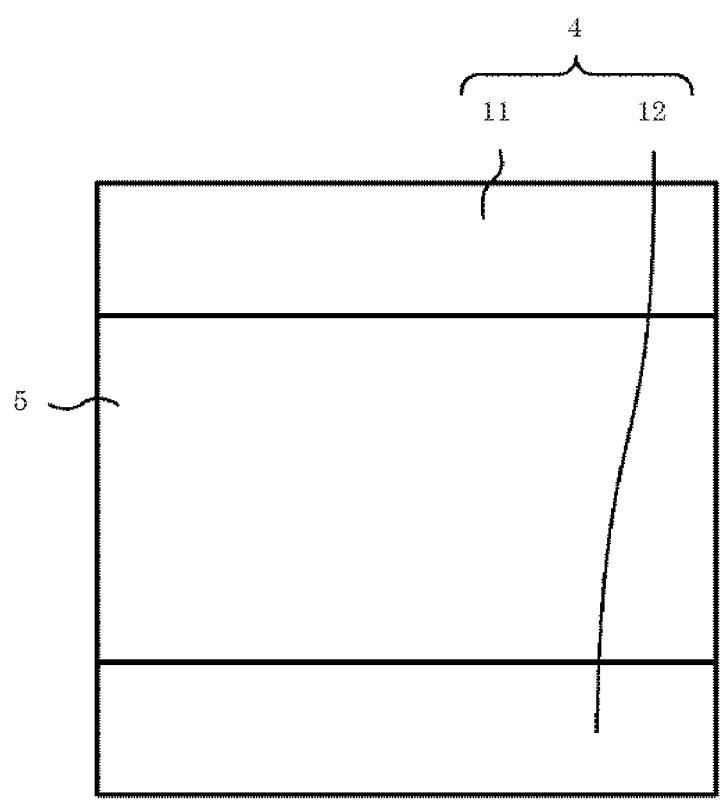
FIG. 18A is a schematic plan view of a semiconductor apparatus according to Embodiment 2.
Figure 18B:
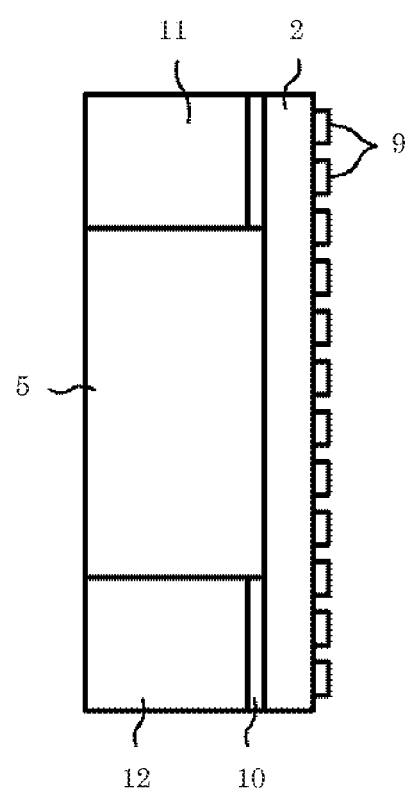
FIG. 18B is a schematic front view of a semiconductor apparatus according to Embodiment 2.
Figure 18C:
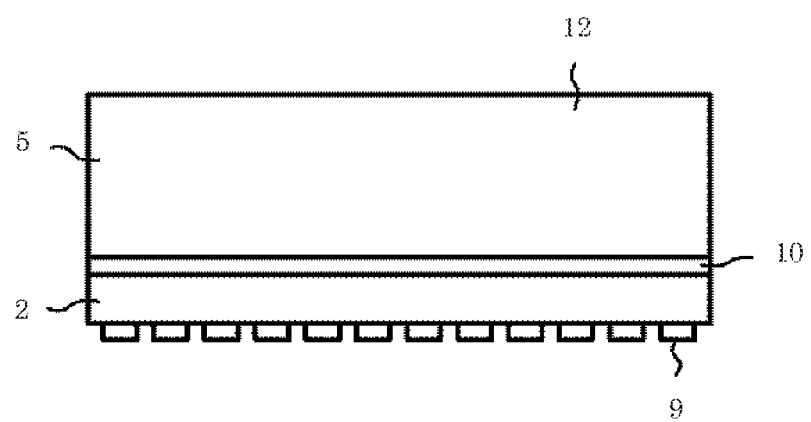
FIG. 18C is a schematic view of a right side of a semiconductor apparatus according to Embodiment 2.

Here, the semiconductor apparatus according to Embodiment 2 will be described with reference to FIG. 18A through FIG. 18C and FIG. 19A through FIG. 19C. The description will focus on the main points of difference with Embodiment 1. FIG. 18A is a schematic plan view of the semiconductor apparatus according to Embodiment 2. FIG. 18B is a schematic front view of the same semiconductor apparatus. FIG. 18C is a schematic view of the right side of the same semiconductor apparatus. Note that FIG. 18B is a view from the right side surface of the semiconductor apparatus illustrated in FIG. 18A, and FIG. 18C is a view from the top side surface of the semiconductor apparatus illustrated in FIG. 18A.

Figure 19A:
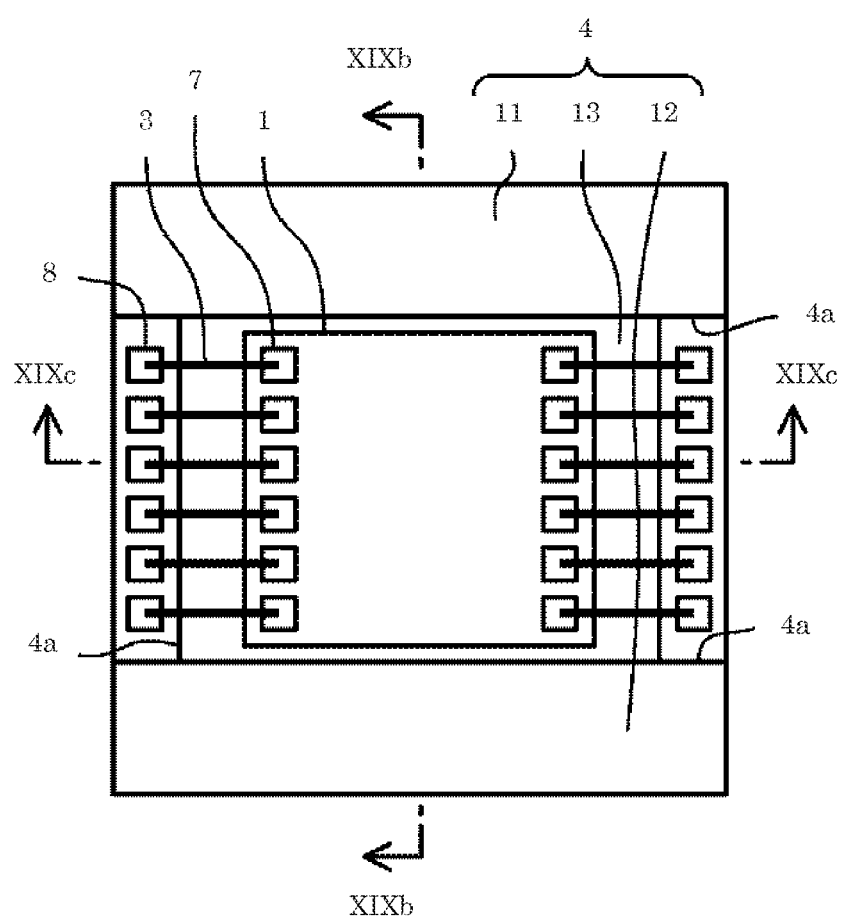
FIG. 19A is a schematic plan view of a semiconductor apparatus according to Embodiment 2, when the encapsulant in FIG. 18A is transparent.
Figure 19B:
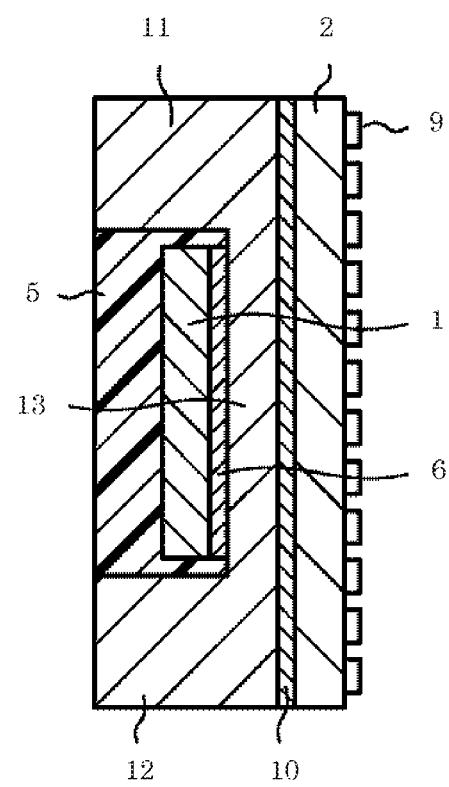
FIG. 19B is a schematic cross sectional view of a semiconductor apparatus according to Embodiment 2, taken at line XIXb-XIXb in FIG. 19A.
Figure 19C:
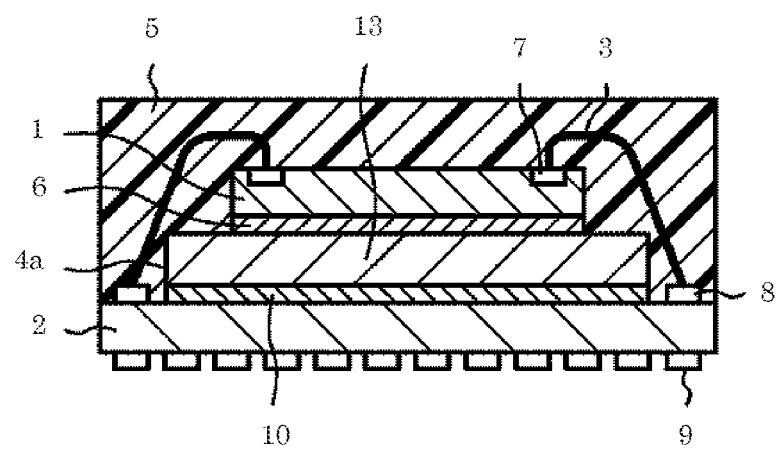
FIG. 19C is a schematic cross sectional view of a semiconductor apparatus according to Embodiment 9, taken at line XIXc-XIXc in FIG. 19A.

FIG. 19A is a schematic plan view of the semiconductor apparatus according to Embodiment 2, when the encapsulant in FIG. 18A is transparent. FIG. 19B is a cross sectional view of the semiconductor apparatus taken at line XIXb-XIXb in FIG. 19A. FIG. 19C is a cross sectional view of the semiconductor apparatus taken at line XIXc-XIXc in FIG. 19A.

As illustrated in FIG. 19A through FIG. 19C, in the semiconductor apparatus according to Embodiment 2, heat dissipating member 4 is fixed to the main surface of base 2 with adhesive 10, and the rear surface of semiconductor device 1, which is the surface of semiconductor device 1 opposite the device surface, is fixed to heat dissipating member 4 with adhesive layer 6.

More specifically, heat dissipating member 4 has an H-shape in a plan view and includes first block 11, second block 12, and third block 13. First block 11 and second block 12 have shapes that extend along two opposing sides of semiconductor device 1 at which electrodes 7 in semiconductor device 1 are not disposed. Third block 13 is disposed below semiconductor device 1 and connects first block 11 and second block 12 together. With this planar configuration, the plurality of internal terminals 8 disposed on the main surface of base are exposed by notched sections 4a of heat dissipating member 4.

The plurality of electrodes 7 disposed on the top surface of semiconductor device 1 and the plurality of internal terminals 8 disposed on the main surface of base 2 and exposed by notched sections 4a of heat dissipating member 4 are connected together on a one-to-one basis with connection members 3.

Moreover, the top and side surfaces of first block 11 and second block 12 of heat dissipating member 4 conform with the external shape of the semiconductor apparatus, as illustrated in FIG. 18A through FIG. 18C. In other words, a side surface of base 2, a side surface of first block 11, and a side surface of encapsulant 5 lie in the same plane, and a side surface of base 2, a side surface of second block 12, and a side surface of encapsulant 5 lie in the same plane. Moreover, the top surface of base 2 and the top surface of encapsulant 5 lie in the same plane.

In this way, in Embodiment 2, the rear surface of semiconductor device 1 can be disposed close to heat dissipating member 4 without heat dissipating member 4 interfering with the region in which connection members 3 are disposed, thereby achieving good conduction of heat from semiconductor device 1 to heat dissipating member 4. Moreover, since inside the semiconductor apparatus the cubic volume of heat dissipating member 4 can be increased in regions other than regions where connection members 3 are disposed, the heat dissipation effectiveness of heat dissipating member 4 can be increased. Moreover, since heat dissipating member 4 is formed below and on the sides of semiconductor device 1, a highly reliable semiconductor apparatus can be achieved due to its high heat dissipation properties, reduction in chance of warpage, and increased strength.

As illustrated in FIG. 19B and FIG. 19C, the height of first block 11 and second block 12 in heat dissipating member 4 measured from the top surface of third block 13 is greater than the height of the peak of connection member 3 (wire loop height), and first block 11 and second block 12 are exposed on the top surface of the semiconductor apparatus.

Unlike the semiconductor apparatus according to Embodiment 1, in the semiconductor apparatus according to Embodiment 2, third block 13 of heat dissipating member 4 is disposed below semiconductor device 1, so the thickness of the semiconductor apparatus increases by the thickness of third block 13. However, on the main surface side of base 2 in the semiconductor apparatus, first block 11 and second block 12 can be arranged in the empty space outside the region in which connection members 3 are disposed. With this, compared to an externally attached heat dissipating member in a semiconductor apparatus manufactured using a conventional wire bonding method, the semiconductor apparatus can be made to be thin, strong, and have high heat dissipation properties.

Manufacturing Method According to Embodiment 2

Figure 20A:
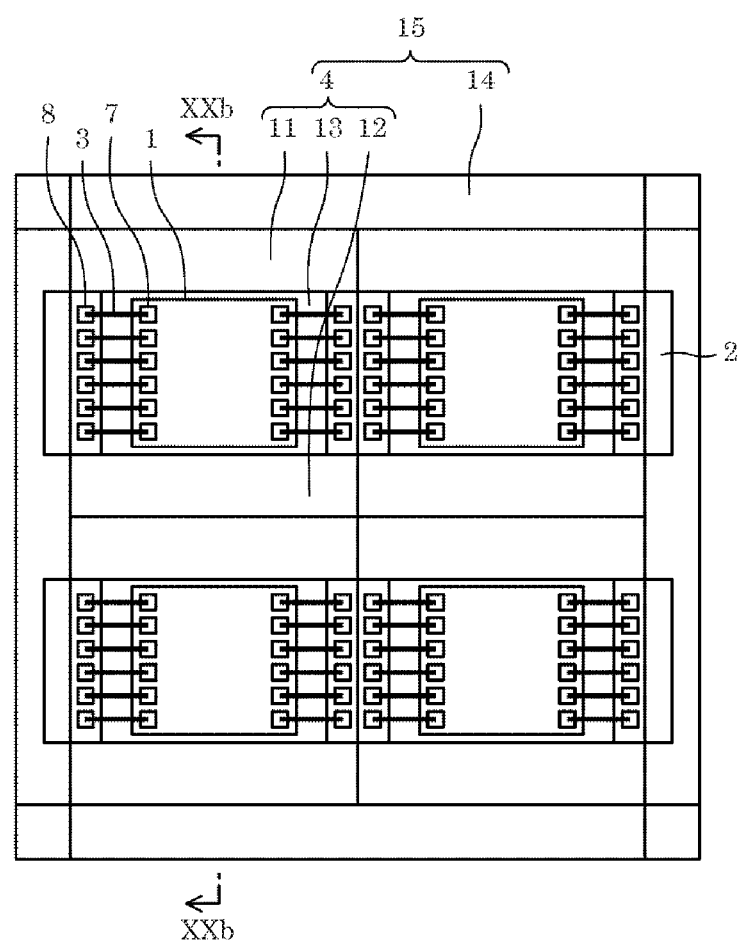
FIG. 20A is a schematic plan view of a heat dissipating member frame in a manufacturing process of a semiconductor apparatus according to Embodiment 2.
Figure 20B:
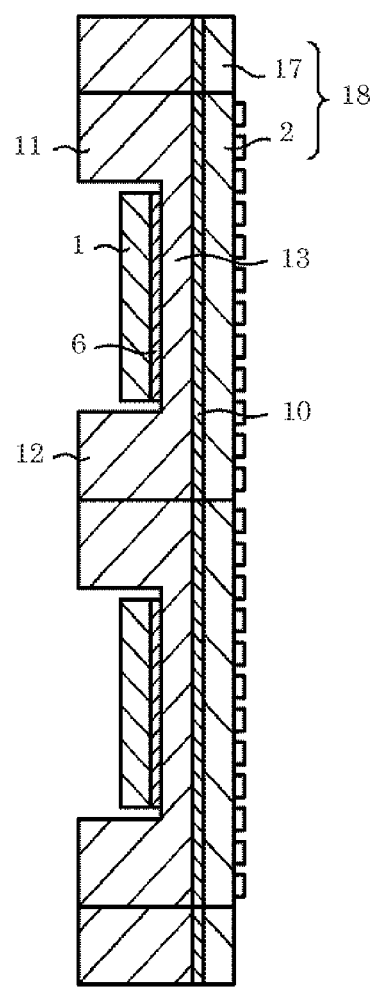
FIG. 20B is a schematic cross sectional view of a heat dissipating member frame in a manufacturing process of a semiconductor apparatus according to Embodiment 2, taken at line XXb-XXb in FIG. 20A.
Figure 21:
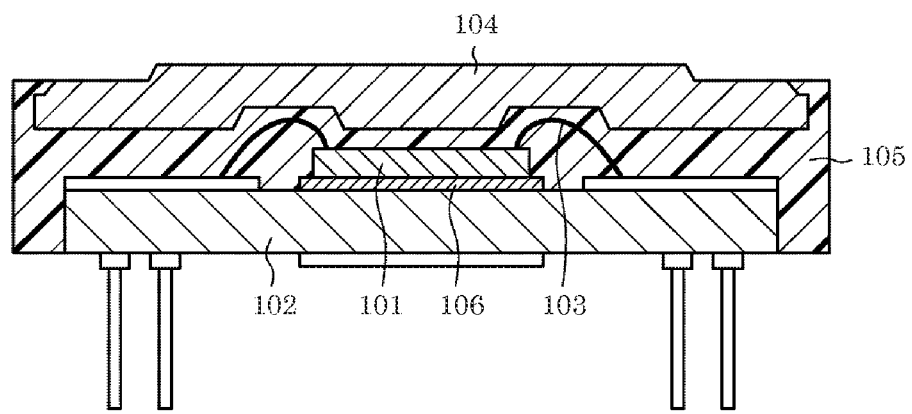
FIG. 21 is a cross sectional view of a semiconductor apparatus according to a first conventional example; and in FIG. 22, (a) through (e) are cross sectional views illustrating a sequence of processes in a method of manufacturing a semiconductor apparatus according to a second conventional example.
Figure 22:
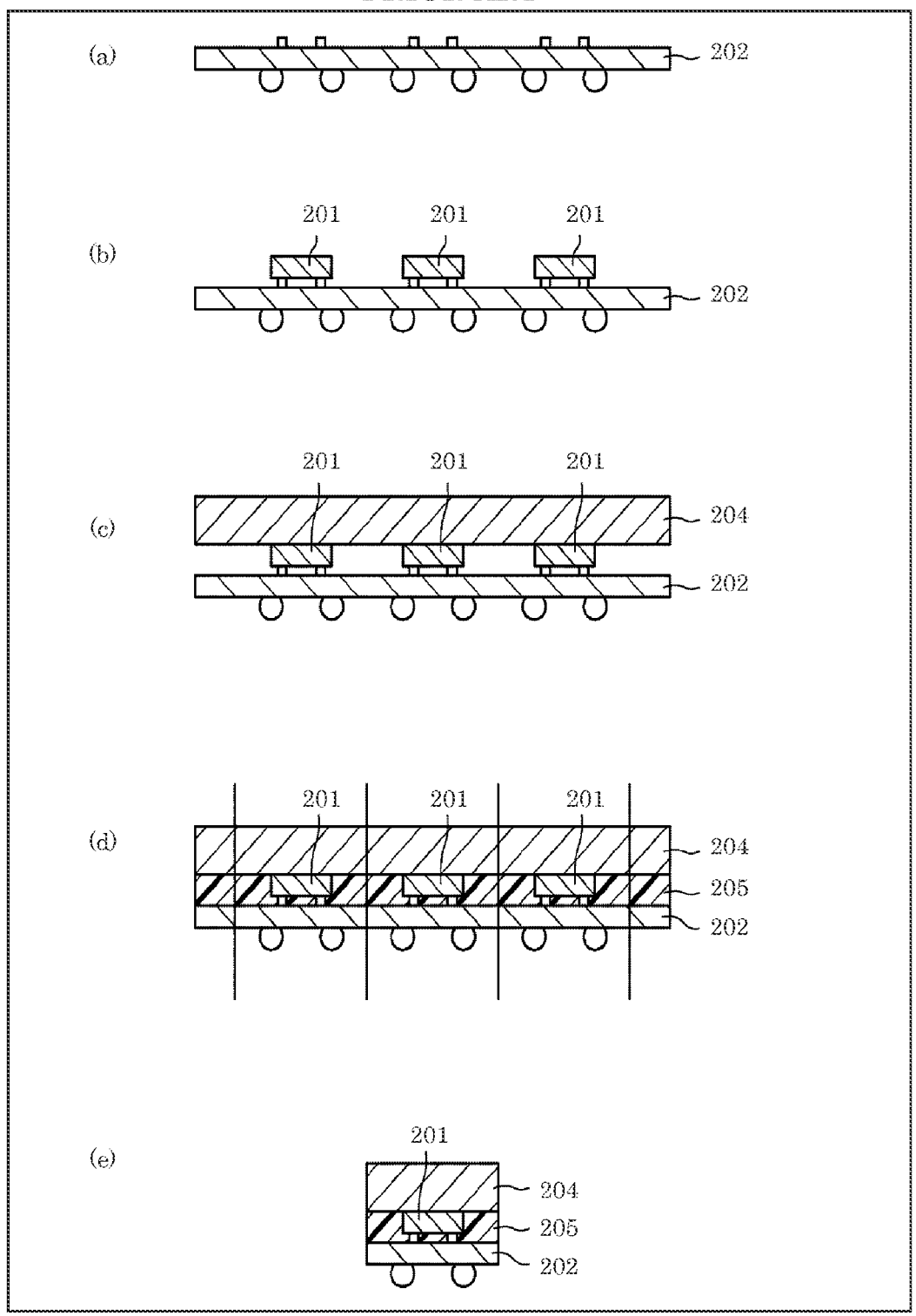

Next, the method of manufacturing the semiconductor apparatus according to Embodiment 2 will be described with reference to FIG. 20A and FIG. 20B. FIG. 20A is a schematic plan view of the heat dissipating member frame in a manufacturing process of the semiconductor apparatus according to Embodiment 2. FIG. 20B is a cross sectional view of the semiconductor apparatus taken at line XXb-XXb in FIG. 20A.

Similar to the manufacturing method according to Embodiment 1, the method of manufacturing the semiconductor apparatus according to Embodiment 2 includes using base frame 18 and heat dissipating member frame 15 and collectively encapsulating base 2 and heat dissipating member 4 arranged in a matrix. Manufacturing processes include a frame bonding process including bonding together base frame 18 and heat dissipating member frame 15, a die bonding process including mounting each semiconductor device 1 on a corresponding one of bases 2, a wire bonding process including wiring together internal terminals 8 on base 2 and electrodes 7 on semiconductor device 1 with connection members 3, an encapsulation process including forming encapsulant 5 so as to cover base 2, heat dissipating member 4, and semiconductor device 1, and a dicing process including separating heat dissipating member frame 15, encapsulant 5, and base frame 18 into individual units to obtain a plurality of semiconductor apparatuses.

FIG. 20A and FIG. 20B illustrate base frame 18 and heat dissipating member frame 15 after the wire bonding process in the method of manufacturing the semiconductor apparatus according to Embodiment 2.

In the subsequent encapsulation process, encapsulant 5 is dispensed on semiconductor device 1, connection member 3, and base 2 to encapsulate them.

In Embodiment 2, when heat dissipating members 4 are disposed in a matrix on base frame 18, the gap between first block 11 and second block 12 is continuous a straight line shape due to the low height of third block 13. Since the straight line gap functions as a flow channel for encapsulant 5, encapsulation can be performed with ease.

As described above, in Embodiment 2, in the semiconductor apparatus which is manufactured using a wire bonding method, since heat dissipating member 4 is incorporated inside the semiconductor apparatus in a manufacturing process of the semiconductor apparatus and formed collectively with the semiconductor apparatus, compared to when the heat dissipating plate is an external component attached in a separate process, the processes can be simplified, thereby maintaining mass productivity.

Note that similar to Variation 1 of Embodiment 1, in Embodiment 2 as well, first block 11 and second block 12 of heat dissipating member 4 may be disposed in a more peripheral position than base 2 and cover side surfaces of sides of base 2 at which internal terminals 8 are not disposed.

Furthermore, Embodiment 1, in which heat dissipating member 4 covers semiconductor device 1 from above, and Embodiment 2, in which heat dissipating member 4 is incorporated below semiconductor device 1, may be combined. In this case, heat dissipation properties of the semiconductor apparatus can be improved even further.

As described above, Embodiment 1, Embodiment 2, and variations thereof are presented as examples of the techniques disclosed in the present disclosure. However, the techniques disclosed herein are not limited to these embodiments and variations; modifications, permutations, additions, and omissions, for example, may be made.

Note that in the above embodiments and variations thereof, base 2 and base frame 18 are exemplified as wiring substrates made of a glass epoxy resin, but base 2 and base frame 18 are not limited to this example. For example, instead of glass epoxy resin, a lead frame including a ceramic or polyimide film wiring substrate, a silicon (Si) interposer, a die pad, and a lead may be used, or a different semiconductor device may be used. For example, base 2 may be one of a lead frame and a second semiconductor device. In other words, base 2 is only required to retain semiconductor device 1 and be electrically connectable to connection member 3. Moreover, connection member 3 is exemplified as a copper (Cu) or gold (Au) wire, but connection member 3 is not limited to these examples. For example, instead of wire boding, ribbon bonding or lead bonding may be performed. Moreover, heat dissipating member 4 is exemplified as a metal or an alloy of that metal, but so long as heat dissipating member 4 is made of a heat conductive material, heat dissipating member 4 is not limited to these examples.

As described above, the embodiments and variations thereof are presented as examples of the techniques disclosed in the present disclosure. To this extent, the accompanying drawings and detailed description are provided.

Thus, the components set forth in the accompanying drawings and detailed description include not only components essential to solve the problems but also components unnecessary to solve the problems for the purpose of illustrating the above non-limiting embodiment. Thus, those unnecessary components should not be deemed essential due to the mere fact that they appear in the accompanying drawings and the detailed description.

The above non-limiting embodiment illustrates the techniques of the present disclosure, and thus various modifications, permutations, additions and omissions are possible in the scope of the appended claims and the equivalents thereof.

INDUSTRIAL APPLICABILITY

The semiconductor apparatus according to the present disclosure is applicable as a semiconductor apparatus installed in electronic devices, and in particular, applicable as a semiconductor apparatus installed in compact electronic devices, such as mobile device.

What is claimed is:

1. A semiconductor apparatus comprising:
   a base having a main surface on which a terminal is disposed;
   a first semiconductor device retained on the main surface of the base and having a top surface on which an electrode is disposed and a bottom surface facing the main surface of the base;
   a connection member connecting the terminal and the electrode;
   an encapsulant disposed on the main surface of the base and covering the terminal, the first semiconductor device and the connection member; and
   a heat dissipating member disposed on the encapsulant and having a space that opens in a direction extending perpendicular to the main surface of the base,
   wherein the encapsulant is disposed in the space,
   in a side view of the base, a peak of the connection member is located inside the space, and
   the heat dissipating member does not cover any portion of the connection member in plan view.

2. The semiconductor apparatus according to claim 1, wherein a side surface of the heat dissipating member, a side surface of the encapsulant, and a side surface of the base lie in a same plane.

3. The semiconductor apparatus according to claim 2, wherein a top surface of the heat dissipating member and a top surface of the encapsulant lie in a same plane.

4. The semiconductor apparatus according to claim 1, wherein
   the heat dissipating member has an H-shape in a plan view and includes a first block, a second block, and a third block,
   the first block and the second block cover a region excluding (i) above the first semiconductor device and (ii) above a region in which the connection member is disposed, and
   the third block connects the first block and the second block together and covers an area above the first semiconductor device.

5. The semiconductor apparatus according to claim 4, wherein
   the third block covers an area above the base, from a first side surface of the base to a second side surface of the base opposite the first side surface,
   the first block is located peripheral to the first side surface of the base and covers the first side surface of the base, and
   the second block is located peripheral to the second side surface of the base and covers the second side surface of the base.

6. The semiconductor apparatus according to claim 5, wherein in the heat dissipating member, the third block is thinner than each of the first block and the second block.

7. The semiconductor apparatus according to claim 5, wherein the third block of the heat dissipating member is thinner than the encapsulant measured from the top surface of the first semiconductor device to a top surface of the encapsulant.

8. The semiconductor apparatus according to claim 1, wherein in a plan view, the space in the heat dissipating member is a notched section exposing a region from where the connection member is disposed to a side surface of the encapsulant.

9. The semiconductor apparatus according to claim 8, wherein in a plan view, the notched section has a width that increases from a central region of the heat dissipating member outward.

10. The semiconductor apparatus according to claim 1, wherein the space is an opening that opens above a region in which the connection member is disposed.

11. The semiconductor apparatus according to claim 10, wherein in a plan view, the opening has a width that increases from a central region of the heat dissipating member outward.

12. The semiconductor apparatus according to claim 10, wherein
    the heat dissipating member extends outward beyond at least one side surface of the base, and the at least one side surface of the base is covered by the heat dissipating member.

13. The semiconductor apparatus according to claim 1, wherein a distance between the heat dissipating member and the first semiconductor device is in a range from 50 μm to 100 μm, inclusive.

14. The semiconductor apparatus according to claim 1, wherein
the encapsulant includes a first encapsulant free of a filler and a second encapsulant containing a filler,
the first encapsulant fills a gap between the heat dissipating member and the first semiconductor device, and
the second encapsulant fills a region excluding the gap between the heat dissipating member and the first semiconductor device.

15. The semiconductor apparatus according to claim 1, wherein
the encapsulant includes a first encapsulant containing a metal and a second encapsulant free of metal,
the first encapsulant fills a gap between the heat dissipating member and the first semiconductor device, and
the second encapsulant fills a region excluding the gap between the heat dissipating member and the first semiconductor device.

16. The semiconductor apparatus according to claim 1, wherein the base is one of a lead frame and a second semiconductor device.

17. A semiconductor apparatus comprising:
a base having a main surface on which a terminal is disposed;
a heat dissipating member disposed on the main surface of the base, in a region excluding the terminal;
a first semiconductor device retained on the heat dissipating member and having a top surface on which an electrode is disposed;
a connection member connecting the terminal and the electrode, the connection member having a peak portion which is the portion of the connection member located the farthest away from the base when viewed in plan;
an encapsulant disposed on the main surface of the base and covering the terminal, the first semiconductor device and the connection member,
wherein,
the heat dissipating member has an H-shape in a plan view and includes a first block, a second block, and a third block,
the first block and the second block cover a region above the base excluding (i) above the first semiconductor device and (ii) above a region in which the connection member is disposed,
the third block connects the first block and the second block together, and
the first block and the second block of the heat dissipating member have top surfaces that are farther than the peak portion of the connection member from the base.

18. The semiconductor apparatus according to claim 17, wherein a side surface of the heat dissipating member, a side surface of the encapsulant, and a side surface of the base lie in a same plane.

19. The semiconductor apparatus according to claim 17, wherein the base is one of a lead frame and a second semiconductor device.

* * * * *